(12) United States Patent
Lien et al.

(10) Patent No.: US 11,887,670 B2
(45) Date of Patent: Jan. 30, 2024

(54) CONTROLLING BIT LINE PRE-CHARGE VOLTAGE SEPARATELY FOR MULTI-LEVEL MEMORY CELLS AND SINGLE-LEVEL MEMORY CELLS TO REDUCE PEAK CURRENT CONSUMPTION

(71) Applicant: SanDisk Technologies LLC, Addison, TX (US)

(72) Inventors: Yu-Chung Lien, San Jose, CA (US); Deepanshu Dutta, Fremont, CA (US); Jiahui Yuan, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 151 days.

(21) Appl. No.: 17/406,224

(22) Filed: Aug. 19, 2021

(65) Prior Publication Data

US 2023/0056891 A1    Feb. 23, 2023

(51) Int. Cl.
| | |
|---|---|
| *G11C 16/10* | (2006.01) |
| *G11C 16/26* | (2006.01) |
| *G11C 16/30* | (2006.01) |
| *G11C 16/04* | (2006.01) |
| *G11C 16/24* | (2006.01) |

(52) U.S. Cl.
CPC ........ *G11C 16/102* (2013.01); *G11C 16/0433* (2013.01); *G11C 16/24* (2013.01); *G11C 16/26* (2013.01); *G11C 16/30* (2013.01)

(58) Field of Classification Search
None
See application file for complete search history.

(56) References Cited

U.S. PATENT DOCUMENTS

| | | | |
|---|---|---|---|
| 8,923,055 B2* | 12/2014 | Baek | G11C 11/5628 365/185.12 |
| 8,995,211 B2 | 3/2015 | Lee | |
| 9,368,222 B2 | 6/2016 | Dunga et al. | |
| 11,328,754 B2* | 5/2022 | Lien | G11C 7/106 |
| 11,532,360 B2* | 12/2022 | Park | G11C 16/30 |
| 2009/0273978 A1 | 11/2009 | Fukuda | |
| 2011/0122692 A1 | 5/2011 | Dutta et al. | |
| 2011/0188317 A1 | 8/2011 | Mui et al. | |

(Continued)

OTHER PUBLICATIONS

International Search Report & The Written Opinion of the International Searching Authority dated Oct. 11, 2022, International Application No. PCT/US2022/027966.

(Continued)

*Primary Examiner* — Kretelia Graham
(74) *Attorney, Agent, or Firm* — Vierra Magen Marcus LLP

(57) ABSTRACT

Apparatuses and techniques are described for controlling a bit line pre-charge voltage in a program operation based on a number of bits per cell, with a goal to reduce peak current consumption. In one aspect, the ramp up of a bit line voltage to an inhibit level is optimized according to the number of bits per cell. The ramp up can involve increasing the bit line voltage from an initial level to a target voltage at a regulated rate, then increasing the bit line voltage from the target voltage to a final voltage at an unregulated rate. In one approach, the regulated ramp rate is less for single-level cell programming compared to multi-level cell programming. The target voltage can also be optimized based on the number of bis per cell.

20 Claims, 19 Drawing Sheets

(56) References Cited

U.S. PATENT DOCUMENTS

2012/0275223 A1 11/2012 Baek
2013/0250688 A1 9/2013 Chen et al.
2021/0241836 A1* 8/2021 Lien .................. G11C 16/32

OTHER PUBLICATIONS

U.S. Appl. No. 17/188,998, filed Mar. 1, 2021.
U.S. Appl. No. 16/778,821, filed Jan. 31, 2020.

* cited by examiner

Fig. 1A
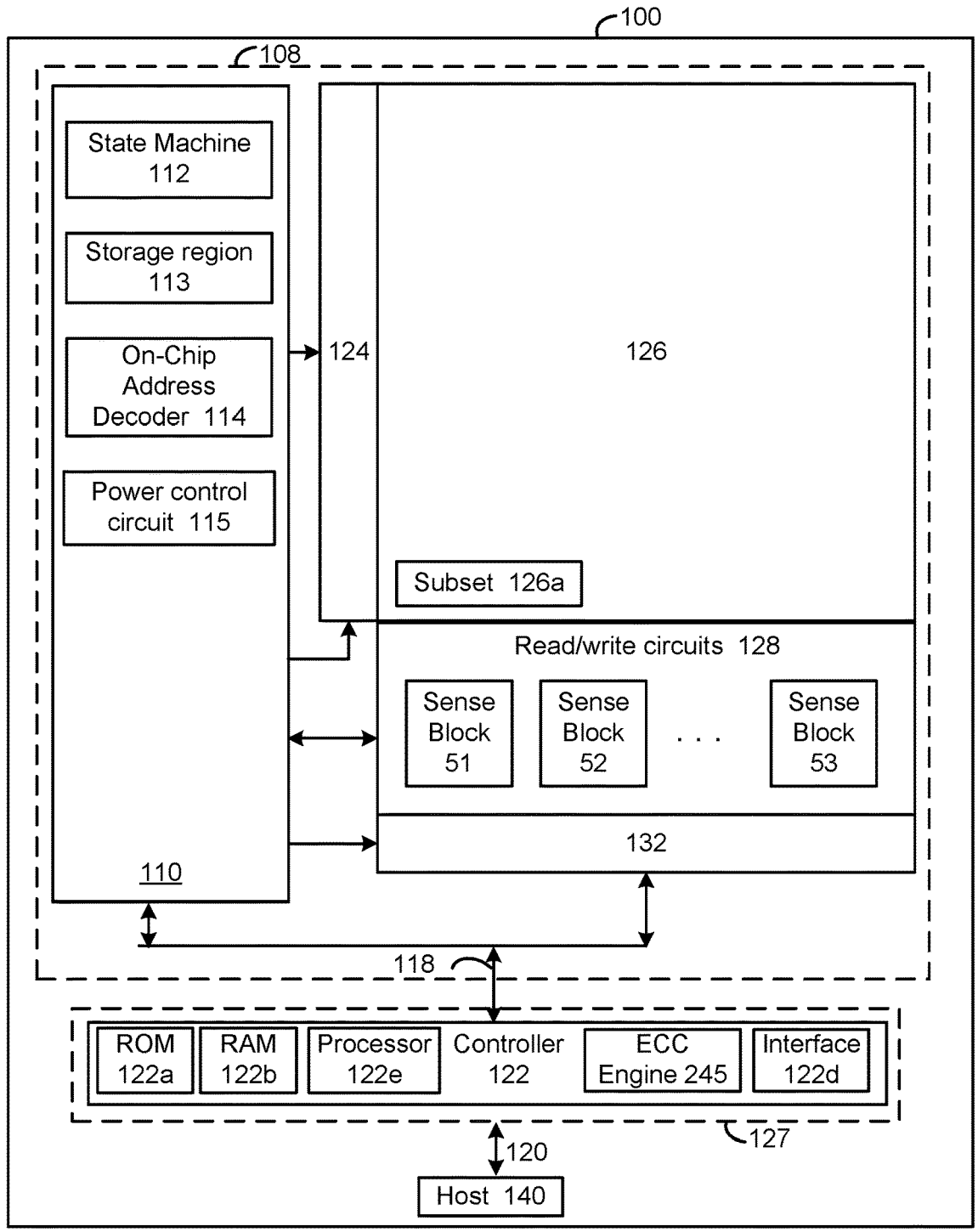
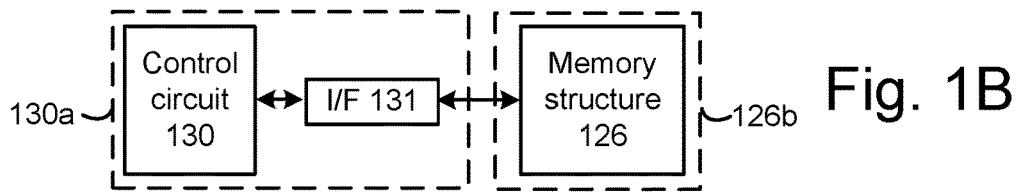
Fig. 1B

| Bit0 | Bit1 | VHSATGT |
|---|---|---|
| 0 | 0 | 75% of VHSA |
| 0 | 1 | 80% of VHSA |
| 1 | 0 | 85% of VHSA |
| 1 | 1 | 90% of VHSA |

| Bit0 | Bit1 | VHSASLOW |
|---|---|---|
| 0 | 0 | RUR1 |
| 0 | 1 | RUR2 |
| 1 | 0 | RUR3 |
| 1 | 1 | RUR4 |

US 11,887,670 B2

CONTROLLING BIT LINE PRE-CHARGE VOLTAGE SEPARATELY FOR MULTI-LEVEL MEMORY CELLS AND SINGLE-LEVEL MEMORY CELLS TO REDUCE PEAK CURRENT CONSUMPTION

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings, for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 1A is a block diagram of an example memory device.

FIG. 1B is a block diagram of an arrangement of the memory device 100 of FIG. 1A in which a control circuit 130 on a first die 130a communicates with the memory structure 126 on a separate second die 126b.

DETAILED DESCRIPTION

Figure 2:
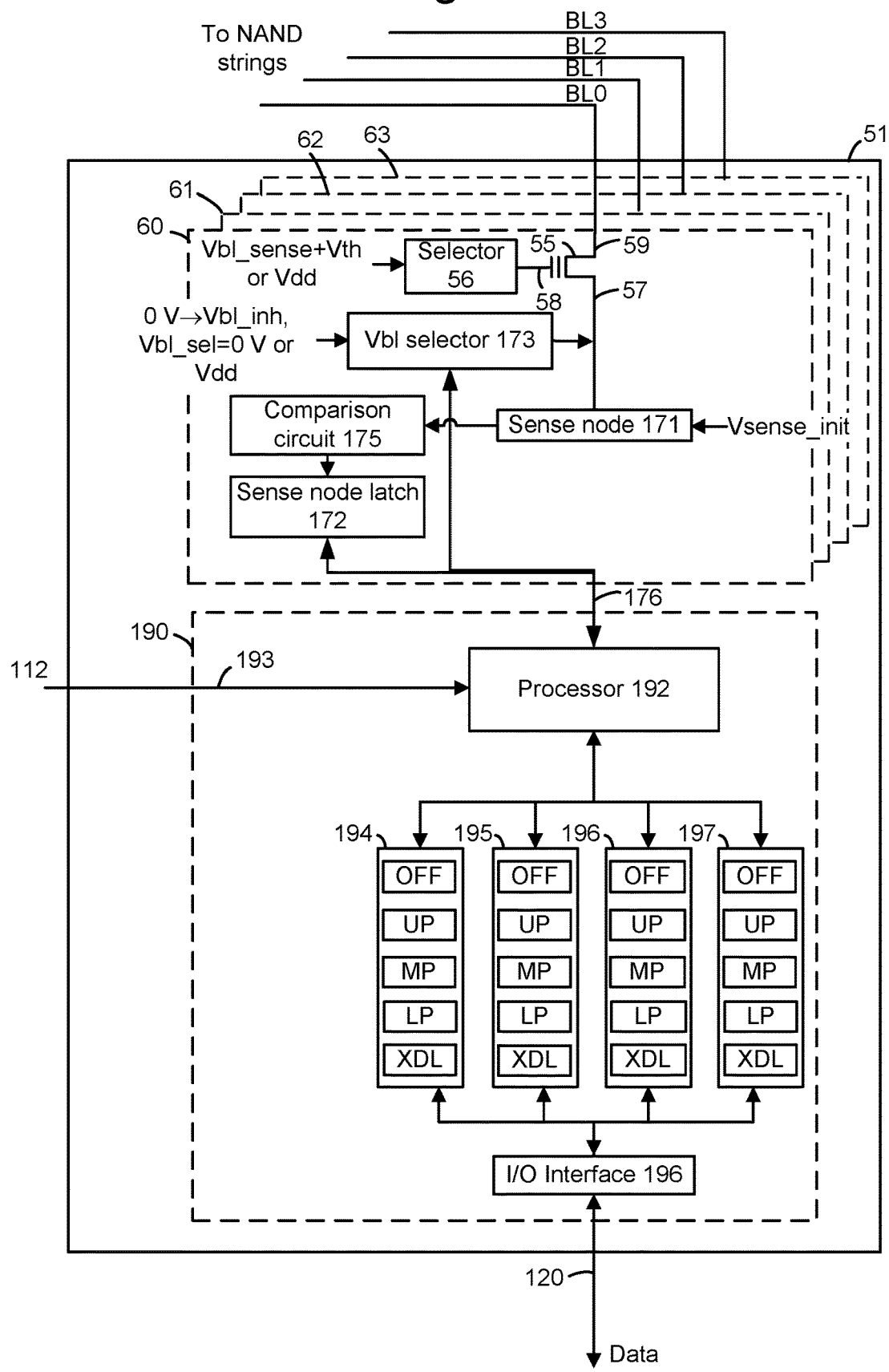
FIG. 2 is a block diagram depicting one embodiment of the sense block 51 of FIG. 1A.

Apparatuses and techniques are described for controlling a bit line pre-charge voltage in a program operation based on a number of bits per cell, with a goal to reduce peak current consumption.

In some memory devices, memory cells are connected to one another such as in NAND strings in a block or sub-block. Each NAND string comprises a number of memory cells connected in series between one or more drain end select gate transistors (referred to as SGD transistors), on a drain end of the NAND string which is connected to a bit line, and one or more source end select gate transistors (referred to as SGS transistors), on a source end of the NAND string or other memory string or set of connected memory cells, which is connected to a source line. The select gate transistors are also referred to as select gates. Further, the memory cells can be arranged with a common control gate line (e.g., word line) which acts a control gate. A set of word lines extends from the source-side of a block to the drain-side of a block. Memory cells can be connected in other ways as well.

In a 3D memory structure, the memory cells may be arranged in vertical NAND strings in a stack in a substrate, where the stack comprises alternating conductive and dielectric layers. The conductive layers act as word lines which are connected to the memory cells. Each NAND string may have the shape of a pillar which intersects with the word lines to form the memory cells. Further, each NAND string includes various layers which extend vertically in the stack, such as a blocking oxide layer, a charge trapping layer, a tunneling layer and a channel layer.

In a 2D memory structure, the memory cells may be arranged in horizontal NAND strings on a substrate.

The memory cells can be programmed to have a threshold voltage (Vth) which corresponds to write data in a program command. Based on an assigned data state, a memory cell will either remain in the erased state or be programmed to a programmed data state. For example, in a one bit per cell block, there are two data states including the erased state and the programmed state. In a two-bit per cell block, there are four data states including the erased state and three higher data states referred to as the A, B and C data states. In a three-bit per cell block, there are eight data states including the erased state and seven higher data states referred to as the A, B, C, D, E, F and G data states. In a four-bit per cell block, there are sixteen data states including the erased state and fifteen higher data states. A block with a single bit per cell is referred to as a single-level cell (SLC) block while a block with multiple bits per cell is referred to as a multi-level cell (MLC) block.

A program operation can include a sequence of program loops, where each program loop is performed by applying a program pulse to a selected word line followed by performing one or more verify tests. During each program pulse, the bit line voltages can be set to enable or inhibit programming for selected and unselected NAND strings, respectively. To inhibit programming, the bit line voltage is increased from an initial level such as 0 V to an inhibit level such as 1.5 V. However, there are many bit lines, typically thousands, which are relatively long and therefore have a relatively high capacitance. As a result, a current consumption of the memory device can reach an undesirable peak level when the bit line voltages are ramped up.

Techniques provided herein address the above and other issues. In one aspect, the ramp up of a bit line voltage to an inhibit level is optimized according to the number of bits per cell of the program operation. The ramp up can involve increasing the bit line voltage from an initial level to a target voltage at a regulated rate, then increasing the bit line voltage from the target voltage to a final voltage at an unregulated rate. In one approach, the regulated ramp up rate is less for SLC programming compared to MLC programming. This approach is optimal as SLC programming inhibits a relatively large portion of the bit lines in a program loop so that inter-bit line capacitance is relatively high. The target voltage can also be optimized based on the number of bis per cell.

These and other features are discussed further below.

FIG. 1A is a block diagram of an example storage device. The memory device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be on a die 127 which is separate from the memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine, an on-chip address decoder 114, and a power control circuit 115. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control circuit 115 controls the power and voltages supplied to the word lines, select gate lines, bit lines and source lines during memory operations. It can include drivers for word lines, SGS and SGD transistors and source lines. See also FIG. 3A. The sense blocks can include bit line drivers, in one approach.

The control circuitry 110 may include hardware, software and/or firmware for performing the processes described herein.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control circuit 115, sense blocks 51, 52, . . . , 53, read/write circuits 128, controller 122, and so forth. The state machine is an electrical circuit that can control operations of the control circuitry 110. In some embodiments, the state machine is implemented by or replaced by a microprocessor, microcontroller and/or RISC processor.

The off-chip controller 122 (which in one embodiment is an electrical circuit) may comprise a processor 122e, memory such as ROM 122a and RAM 122b and an error-correction code (ECC) engine 245. The ECC engine can correct a number of read errors. The RAM 122b can be a DRAM which stores non-committed data, for example. During programming, a copy of the data to be programmed is stored in the RAM 122b until the programming is successfully completed. In response to the successful completion, the data is erased from the RAM 122b and is committed or released to the block of memory cells. The RAM 122b may store one or more word lines of data.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The memory in the controller 122, such as such as ROM 122a and RAM 122b, comprises code such as a set of instructions, and the processor is operable to execute the set of instructions to provide the functionality described herein. Alternatively or additionally, the processor can access code from a subset 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122e fetches the boot code from the ROM 122a or the subset 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage signals including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable memory devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory (DRAM) or static random access memory (SRAM) devices, non-volatile memory devices, such as resistive random access memory (ReRAM), electrically erasable programmable read-only memory (EEPROM), flash memory (which can also be considered a subset of EEPROM), ferroelectric random access memory (FRAM), and magnetoresistive random access memory (MRAM), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. See an example column in FIG. 5. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

FIG. 1B is a block diagram of an arrangement of the memory device 100 of FIG. 1A in which a control circuit 130 on a first die 130a communicates with the memory structure 126 on a separate second die 126b. The control circuit may communicate with the memory structure and the die 126b via a memory interface 131, for example, similar to the memory interface 122d. Examples of a memory interface (I/F) include the Common Flash Memory Interface of JEDEC. The techniques described herein can be implemented with a control die 130a bonded to one or more memory die 126b, where the memory die includes the memory structure 126 and the control die includes a control circuit 130 representing all, or subset, of the peripheral circuits of the memory structure. The control circuit can be on the same die as the plurality of memory cells, or on a different die than the plurality of memory cells.

For example, the memory structure may contain non-volatile memory cells. In some embodiments, the memory die and the control die are bonded together. The control circuit 130 can comprise a set of electrical circuits that perform memory operations (e.g., write, read, erase and others) on the memory structure. The control circuit can include the state machine 112, storage region 113, on-chip address decoder 114 and power control circuit 115. In another embodiment, one portion of the read/write circuits 128 are located on the control die 130a and another portion of the read/write circuits are located on memory die 126b. For example, the read/write circuits may contain sense amplifiers. The sense amplifiers can be located on the control die and/or the memory die.

In an example implementation, the control circuit 130 is configured to connect to a NAND string and a substrate, and the memory interface 131 is connected to the control circuit. The circuit can be configured to issue command via the memory interface to apply different voltage signals to bit lines, word lines, select gate lines, and a CELSRC line (source line), for example. The circuit can be configured to issue command via the memory interface to implement the techniques discussed herein.

The term "memory die" can refer to a semiconductor die that contains non-volatile memory cells for storage of data. The term, "control circuit die" can refer to a semiconductor die that contains control circuitry for performing memory operations on non-volatile memory cells on a memory die. Typically, numerous semiconductor die are formed from a single semiconductor wafer.

FIG. 2 is a block diagram depicting one embodiment of the sense block 51 of FIG. 1A. An individual sense block 51 is partitioned into one or more core portions, referred to as sense circuits 60-63 or sense amplifiers, and a common portion, referred to as a managing circuit 190. In one embodiment, each sense circuit is connected to a respective bit line which in turn is connected to one or more NAND strings. For example, in a configuration consistent with FIG. 7, each bit line is connected to four NAND strings, with one NAND string per sub-block. A common managing circuit 190 is connected to a set of multiple, e.g., four or eight, sense circuits. Each of the sense circuits in a group communicates with the associated managing circuit via data bus 176. Thus, there are one or more managing circuits which communicate with the sense circuits of a set of storage elements (memory cells).

The sense circuit 60, as an example, operates during a program loop to provide a pre-charge/program-inhibit voltage to an unselected bit line or a program-enable voltage to a selected bit line. An unselected bit line is connected to an unselected NAND string and to an unselected memory cell therein. An unselected memory cell can be a memory cell in an unselected NAND string, where the memory cell is connected to a selected or unselected word line. An unselected memory cell can also be a memory cell in a selected NAND string, where the memory cell is connected to an unselected word line. A selected bit line is connected to a selected NAND string and to a selected memory cell therein.

The sense circuit 60 also operates during a verify test in a program loop to sense a memory cell to determine whether it has completed programming by reaching an assigned data state, e.g., as indicated by its Vth exceeding the verify voltage of the assigned data state. The sense circuit 60 also operates during a read operation to determine the data state to which a memory cell has been programmed. The sense circuit 60 also operates in an erase operation during a verify test to determine whether a plurality of memory cells have a Vth below a verify voltage. As described further below, a verify test can be performed for the memory cells connected to all of the word lines in a block, or to memory cells connected to odd- or even-numbered word lines. The sense circuit performs sensing by determining whether a conduction current in a connected bit line is above or below a predetermined threshold level. This indicates whether the Vth of the memory cell is below or above, respectively, the word line voltage.

The sense circuit may include a selector 56 or switch connected to a transistor 55 (e.g., an nMOS). Based on voltages at the control gate 58 and drain 57 of the transistor 55, the transistor can operate as a pass gate or as a bit line clamp. When the voltage at the control gate is sufficiently higher than the voltage on the drain, the transistor operates as a pass gate to pass the voltage at the drain to the bit line (BL) at the source 59 of the transistor. For example, a program-inhibit voltage such as 1-2 V may be passed when pre-charging and inhibiting an unselected NAND string. Or, a program-enable voltage such as 0 V may be passed to allow programming in a selected NAND string. The selector 56 may pass a power supply voltage Vdd, e.g., 3-4 V to the control gate of the transistor 55 to cause it to operate as a pass gate.

When the voltage at the control gate is lower than the voltage on the drain, the transistor 55 operates as a source-follower to set or clamp the bit line voltage at Vcg-Vth, where Vcg is the voltage on the control gate 58 and Vth, e.g., 0.7 V, is the threshold voltage of the transistor 55. This assumes the source line is at 0 V. If Vsrc is non-zero, the bit line voltage is clamped at Vcg-Vsrc-Vth. The transistor is therefore sometimes referred to as a bit line clamp (BLC) transistor, and the voltage Vcg on the control gate 58 is referred to as a bit line clamp voltage, Vblc. This mode can be used during sensing operations such as read and verify operations. The bit line voltage is thus set by the transistor 55 based on the voltage output by the selector 56. For example, the selector 56 may pass Vbl_sense+Vth, e.g., 1.5 V, to the control gate of the transistor 55 to provide Vbl_sense, e.g., 0.8 V, on the bit line. A Vbl selector 173 may pass a relatively high voltage such as Vdd to the drain 57, which is higher than the control gate voltage on the transistor 55, to provide the source-follower mode during sensing operations. Vbl refers to the bit line voltage.

The Vbl selector 173 can pass one of a number of voltage signals. For example, the Vbl selector can pass a program-inhibit voltage signal which increases from an initial voltage, e.g., 0 V, to a program inhibit voltage, e.g., Vbl_inh for respective bit lines of unselected NAND string during a program loop. The Vbl selector 173 can pass a program-enable voltage signal such as 0 V for respective bit lines of selected NAND strings during a program loop. The Vbl selector may select a voltage signal from the BL voltage driver 340 in FIG. 3A based on commands from the processor 192, for example.

In one approach, the selector 56 of each sense circuit can be controlled separately from the selectors of other sense circuits. The Vbl selector 173 of each sense circuit can also be controlled separately from the Vbl selectors of other sense circuits.

During sensing, a sense node 171 is charged up to an initial voltage, Vsense_init, such as 3 V. The sense node is then passed to the bit line via the transistor 55, and an amount of decay of the sense node is used to determine whether a memory cell is in a conductive or non-conductive state. The amount of decay of the sense node also indicates whether a current Icell in the memory cell exceeds a reference current, Iref. If Icell<=Iref, the memory cell is in a non-conductive state and if Icell>Iref, the memory cell is in a conductive state.

In particular, the comparison circuit 175 determines the amount of decay by comparing the sense node voltage to a trip voltage at a sense time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 172 is set to 0 or 1, for example, by the comparison circuit 175 based on whether the memory cell is in a conductive or non-conductive state, respectively. For example, in a program-verify test, a 0 can denote fail and a 1 can denote pass. The bit in the sense node latch can be read out in a state bit scan operation of a PCHSEL operation, or flipped from 0 to 1 in an FF fill operation.

The bit in the sense node latch can also be used in a lockout scan to decide whether to set a bit line voltage to an inhibit or program level in a next program loop. The latches 194-197 may be considered to be data state latches or user data latches because they store the data to be programmed into the memory cells.

The managing circuit 190 comprises a processor 192, four example sets of data latches 194-197 for the sense circuits 60-63, respectively, and an I/O interface 196 coupled between the sets of data latches and the data bus 120. Each set of data latches can include a data transfer latch XDL and user data latches. With three bits per cell, for example, the data transfer latches LP, MP and UP can be used to store data for a lower, middle and upper page of data, respectively. An offset latch OFF can be used to track whether a memory cell has completed a verify test using an offset verify voltage, which is lower than the final verify voltage of a data state. When a memory cell has a Vth greater than the offset verify voltage of its assigned data state, but lower than the final verify voltage of its assigned data state, it will be programmed with a reduced programming speed during the next program pulse by applying an elevated bit line voltage such as 0.7 V. The XDL latch is used to transfer data to and from the user data latches LP, MP and UP.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 176. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is connected in a wired-OR connection. A wired OR connection or line can be provided by connecting multiple wires together at a node, where each wire carries a high or low input signal from a respective processor, and an output of the node is high if any of the input signals is high. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120. During reprogramming, a respective set of data latches of a memory cell can store data indicating when to enable the memory cell for reprogramming based on the program pulse magnitude.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 192 monitors the read back memory state relative to the desired memory state. When the two agree, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain milestones in a program operations. For example, latches may identify that a memory cell's Vth is below a particular verify voltage. The data latches indicate whether a memory cell currently stores one or more bits from a page of data. For example, the LP, MP and UP latches can be flipped (e.g., from 0 to 1) when a lower, middle, upper or top page bit, respectively, is stored in an associated memory cell. All 1's in the latches indicate that an associated memory cell has completed programming.

Figure 3A:
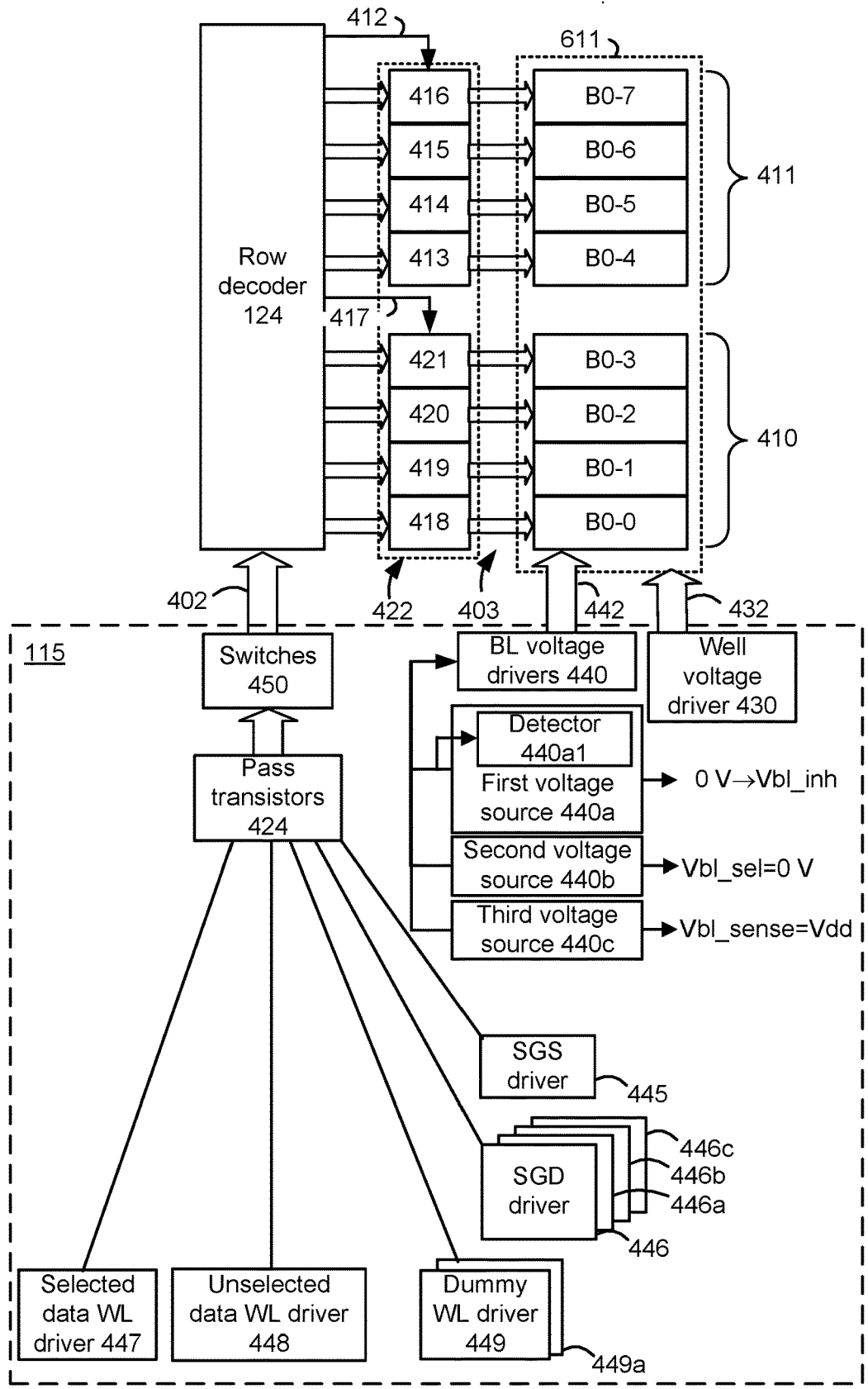
FIG. 3A depicts an example implementation of the power control circuit 115 of FIG. 1A for providing voltages to blocks of memory cells.

FIG. 3A depicts an example implementation of the power control circuit 115 of FIG. 1A for providing voltages to blocks of memory cells. The circuitry shown can be repeated for each plane of a die, in one approach. In this example, the memory structure 126 includes a set of four blocks, B0-0 to B0-3, in one plane, P0, and another set of four blocks, B1-0 to B1-3, in another plane, P1, consistent with FIG. 4. Generally, the blocks can be in one or more planes. The row decoder 124 of FIG. 1A provides voltages to word lines and select gate control lines of each block via pass transistors 422. In one approach, a separate row decoder is provided for each block. The row decoder can be provided one side of a block. The row decoder provides a control signal to pass transistors which connect the blocks to the row decoder. In one approach, the pass transistors of each set of blocks are controlled by a common control gate voltage. Thus, the pass transistors for a set of blocks are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 412 is connected to sets of pass transistors 413, 414, 415 and 416, which in turn are connected to control gate lines of B0-4, B0-5, B0-6 and B0-7, respectively. A control gate line 417 is connected to sets of pass transistors 418, 419, 420 and 421, which in turn are connected to control gate lines of B0-0, B0-1, B0-2 and B0-3, respectively.

Typically, program or read operations are performed on one selected sub-block at a time in a block. An erase operation may be performed on a selected block or sub-block. The row decoder can connect global control lines 402 to local control lines 403. The control lines represent conductive paths. Voltages are provided on the global control lines from a number of voltage drivers. Some of the voltage drivers may provide voltages to switches 450 which connect to the global control lines. Pass transistors 424 are controlled to pass voltages from the voltage drivers to the switches 450.

The voltage drivers can include a selected data word line (WL) driver 447, which provides a voltage on a data word line selected during a program or read operation. The driver 447 can provide a pre-charge voltage and a program voltage on WLn during a program loop of a program operation. A driver 448 can be used for unselected data word lines, and dummy word line drivers 449 and 449a can be used to provide voltages on dummy word lines WLDD and WLDS, respectively, in FIG. 5. For example, the driver 448 can be used to apply a pre-charge voltage and a pass voltage on the unselected word lines during a program loop of a program operation.

The voltage drivers can also include separate SGD drivers for each sub-block. For example, SGD drivers 446, 446a, 446b and 446c can be provided for SB0, SB1, SB2 and SB3, respectively, such as in FIG. 7. In one option, an SGS driver 445 is common to the different sub-blocks in a block.

The various components, including the row decoder, may receive commands from a controller such as the state machine 112 or the controller 122 to perform the functions described herein.

The well voltage driver 430 provides a source voltage Vsrc to the well region 591 (FIG. 5) in the substrate, via control lines 432. The well voltage driver 430 is one example of a source line driver, where the well region 591 is a source line, e.g., a conductive path connected to the source ends of the NAND strings. In one approach, the well region 592 is common to the blocks. A set of bit lines 442 is also shared by the blocks.

Bit line voltage drivers 440 include voltage sources which provide voltages to the bit lines. For example, the bit line voltage drivers can include a first voltage source 440a which is configured to output a program-inhibit voltage signal. This signal increases from an initial level such as 0 V to a final, peak level such as Vbl_inh (also referred to VHSA), to pre-charge a channel of a respective NAND string and prevent programming of memory cells in the NAND string. As mentioned at the outset, various characteristics of the program-inhibit voltage signal can be adjusted as described herein based on factors such as the number of bits per cell. These characteristics can include the regulated ramp up rate and the target voltage or transition voltage for the regulated ramp up. When the program-inhibit voltage signal is below the target voltage, it may be increased at a regulated ramp rate. When the program-inhibit voltage signal is above the target voltage, it may be increased at an unregulated ramp rate. See FIG. 16A-16C.

The first voltage source 440a includes a detector 440a1 which detects when the output voltage reaches a specified percentage or portion of the final voltage, Vbl_inh, such as 75% or 90%, as discussed in connection with FIG. 13A-13C. This is the target voltage, as referred to a s VHSATGT.

The bit line voltage drivers can also include a second voltage source 440b which is configured to output a program-enable voltage signal. This signal can have a fixed voltage such as 0 V which allows programming to occur for a selected memory cell in a respective NAND string. The bit line voltage drivers can also include a third voltage source 440c which is configured to output a fixed voltage, Vbl_sense, which allows sensing to occur for a selected memory cell in the respective NAND string. The sensing can occur during a read or a verify test. The voltage sources 440a, 440b and 440c may be connected to the sense circuits and used to provide voltages to the Vbl selector 173 of FIG. 2, for example.

In a stacked memory device such as depicted in FIGS. 4 to 8, sets of connected memory cells may be arranged in NAND strings which extend vertically upward from the substrate. The bottom (or source end) of each NAND string is in contact with the substrate, e.g., the well region, and the top end (or drain end) of each NAND string is connected to a respective bit line, in one approach.

Figure 3B:
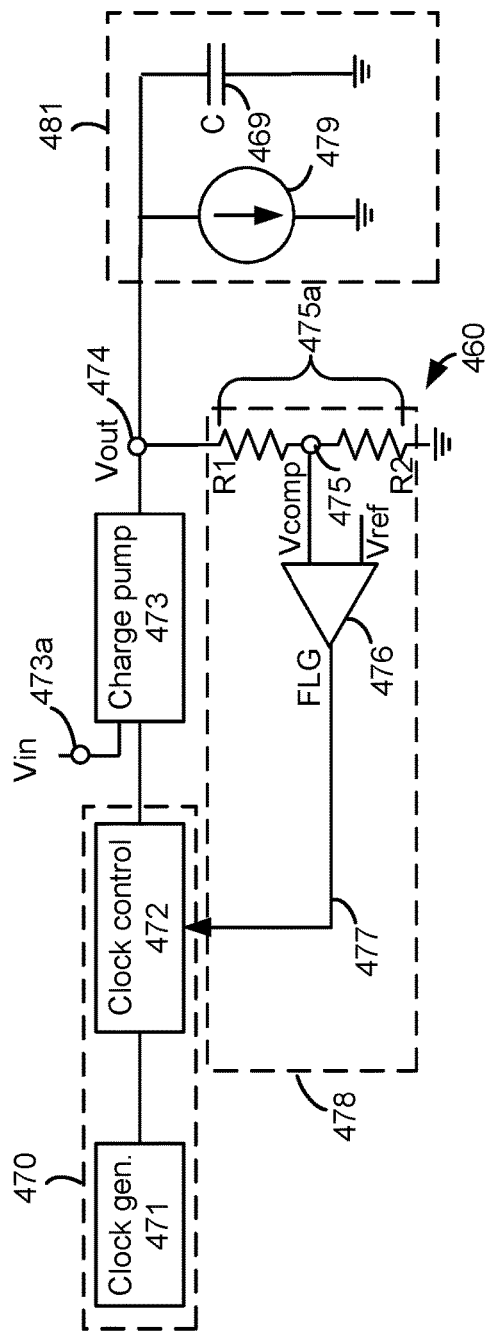
FIG. 3B depicts a charge pump circuit 460 as an example implementation of the first voltage source 440a of FIG. 3A.

FIG. 3B depicts a charge pump circuit 460 as an example implementation of the first voltage source 440a of FIG. 3A. A similar charge pump circuit could be provided for the voltage sources 440b and 440c of FIG. 3A. The charge pump circuit is connected to a load 481. The load may include a current sink 479, as an example of a DC load, and/or a capacitor 469, as an example of an AC load. The load can represent a component in a circuit, such as a bit line, which operates using a specified input voltage.

The charge pump circuit includes a clock source 470 which provides a clock signal constantly or alternatingly to a charge pump 473. The clock source, which is a circuit, includes a clock generator 471 which outputs a clock signal at a specified frequency to a clock control circuit 472. The clock control circuit 472 either blocks the signal from reaching the charge pump, or passes the clock signal to the charge pump. The clock control circuit therefore provides a gating function. The clock signal is responsive to a feedback circuit 478 which includes a feedback path 477, a comparator 476 and a voltage divider 475a. The voltage divider 475a divides the output voltage Vout using resistors R1 and R2 to provide a comparison voltage Vcomp at an output node 475. Vcomp is compared to a reference voltage Vref at the comparator to set a flag FLG. FLG=0 if Vcomp>Vref and FLG=1 if Vcomp<=Vref. Note that Vcomp is a known fraction (R2/(R1+R2) of Vout, so that a comparison of Vcomp to Vref by the comparator is equivalent to a comparison of Vout to a specified output voltage, Vout_spec.

When FLG=1, the clock control circuit passes the clock signal to the charge pump to operate the charge pump in a pumping mode, where charge is transferred from an input node 473a at an input voltage Vin to the output node. When FLG=0, the clock control circuit does not pass the clock signal to the charge pump, so that the charge pump operates in a non-pumping mode, where charge is not transferred from the input node to the output node 474. Vout will tend to decay in the non-pumping mode as the load is driven.

Figure 3C:
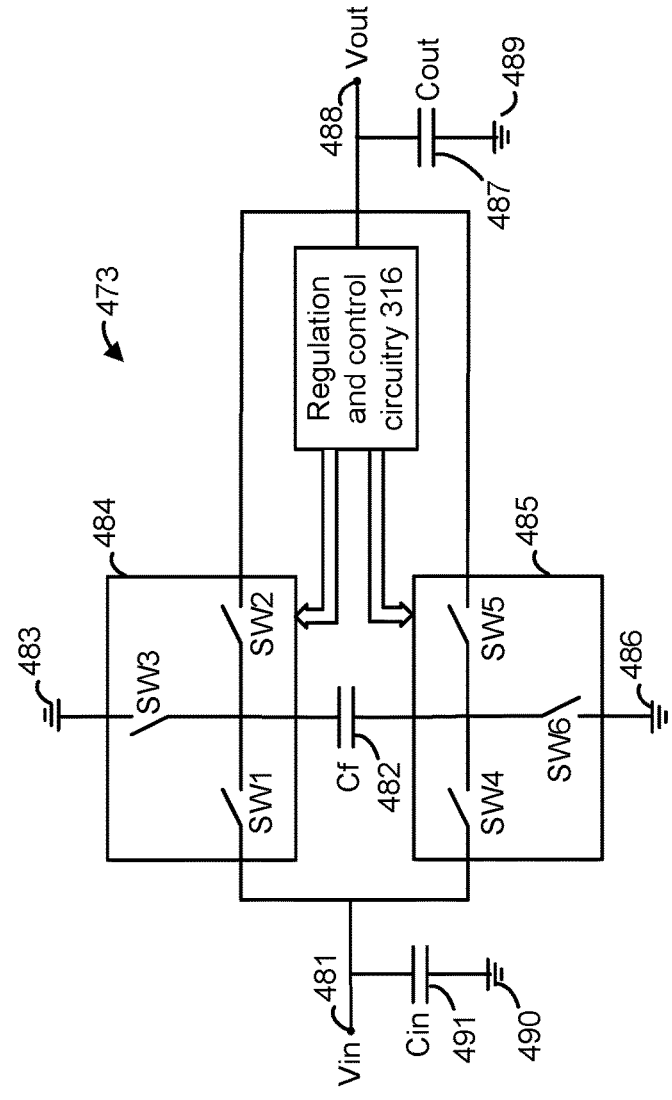
FIG. 3C depicts an example implementation of the charge pump 473 of FIG. 3B.

FIG. 3C depicts an example implementation of the charge pump 473 of FIG. 3B. A single-stage charge pump is depicted. A charge pump generally refers to a switching voltage converter that employs an intermediate capacitive storage element which is sometimes referred to as a flying capacitor or a charge transfer capacitor. One or more flying capacitors can be used. Moreover, a charge pump can include multiple stages connected in series to obtain special features such as a high output voltage and a greater range of output voltages. A charge pump can be constructed or configured for providing voltage conversion for applications including: multiplier, divider, inverter and follower. The principles discussed herein can be applied to one or more stages, and to one or more capacitors in a stage. The charge pump 473 is a generalized embodiment which can be controlled for multiplier, divider, inverter and follower applications. The charge pump 473 includes an input node 473a at which a voltage Vin is applied. For example, Vin may be a fixed power supply voltage sometimes referred to as Vdd in a semiconductor chip. Charge from the voltage is maintained in an input capacitor Cin 491 which is connected to a ground node 490.

A first set of switches 484 and a second set of switches 485 are controlled by regulation and control circuitry 316 to transfer charge from the input node 473a to a flying capacitor Cf 482, and from Cf 482 to an output node 488. Vout is a resulting voltage at the output node 488, and can be greater than or less than Vin. The output node is coupled to an output capacitor Cout 487, which is connected to a ground node 489. The first set of switches 484 includes switches SW1, SW2 and SW3 which are star-connected to one terminal (such as the top conductor) of Cf. The switches may be MOSFETs, bipolar junction transistors, relay switches, or the like. SW1 connects the top conductor of Cf to the input node 473*a* to receive a charge from Vin. SW2 connects the top conductor of Cf to the output node 488 to transfer its charge to the output node. SW3 connects the top conductor of Cf to a ground node 483. Similarly, the second set of switches 485 includes switches SW4, SW5 and SW6 which are star-connected to another terminal (such as the bottom conductor) of Cf. SW4 connects the bottom conductor of Cf to the input node 473*a* to receive a charge from Vin. SW5 connects the bottom conductor of Cf to the output node 488 to transfer its charge to the output node. SW6 connects the bottom conductor of Cf to a ground node 486.

Generally, the charge pump operation includes two main phases: charging Cf from the input node, and discharging Cf into the output node. During each phase, one of the switches in each set of switches is closed, connecting Cf to either the input node, the output node, or a ground node. Further, the regulation and control circuitry 316 provides the switches with appropriate control signals, including frequency, phases, amplitudes, delays, etc., depending on the particular application. The regulation and control circuitry 316 may communicate with the output node 488 as well such as to detect its level. Note that the circuits shown are examples only, as various modifications can be made.

Figure 4:
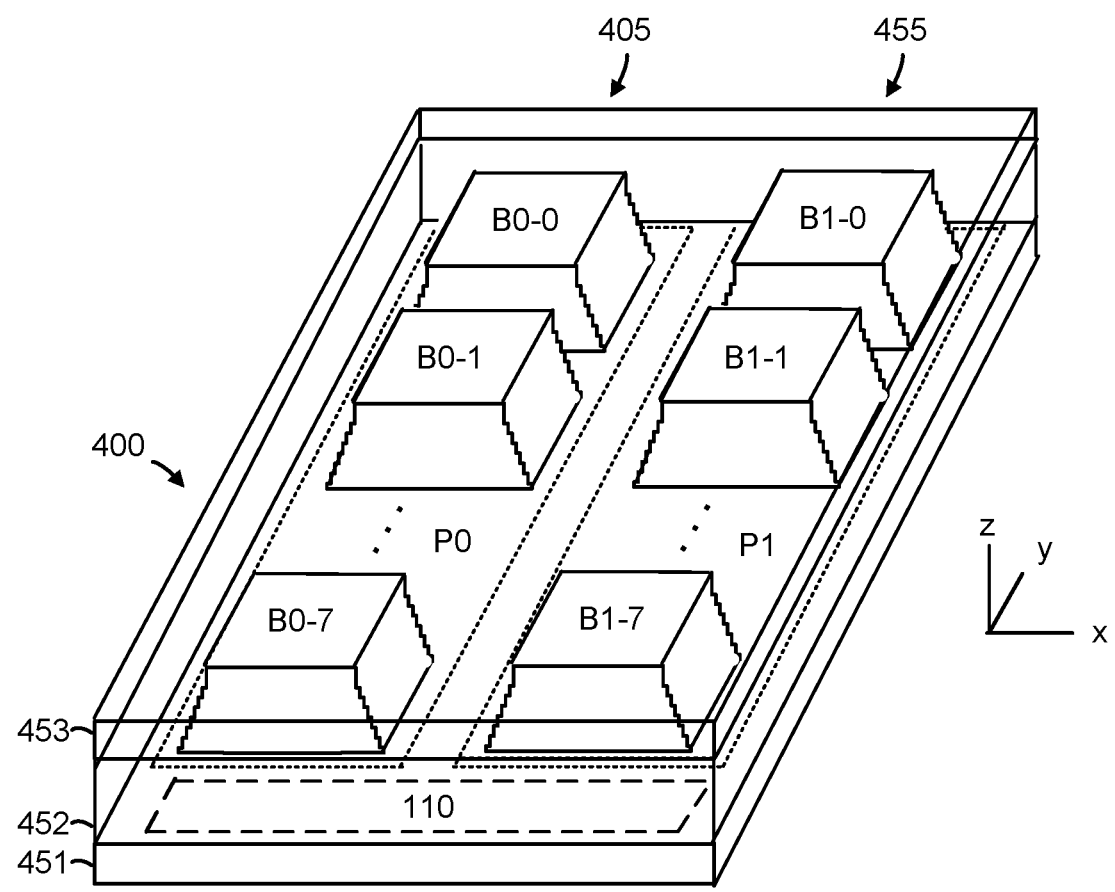
FIG. 4 is a perspective view of an example memory die 400 in which blocks are provided in respective planes P0 and P1, consistent with FIG. 3A.

FIG. 4 is a perspective view of an example memory die 400 in which blocks are provided in respective planes P0 and P1, consistent with FIG. 3A. The memory die includes a substrate 451, an intermediate region 452 in which blocks of memory cells are formed, and an upper region 453 in which one or more upper metal layers are patterned such as to form bit lines. Planes P0 and P1 represent respective isolation regions which are formed in the substrate 451. Further, a first block sequence 405 of a number n blocks, labelled B0-0 to B0-*n*-1, are formed in P0, and a second block sequence 455 of a number n blocks, labelled B1-0 to B1-*n*-1, are formed in P1. Each plane may have associated row and column control circuitry, such as the row decoder 124, read/write circuits 128 and column decoder 132 of FIG. 1A.

The control circuitry 110, which may be located in a peripheral area of the die, may be shared among the planes, in one approach. Each plane may have a separate set of bit lines.

By providing blocks of memory cells in multiple planes, parallel operations can be performed in the planes. For example, blocks in different planes can be erased concurrently.

The substrate 451 can also carry circuitry under the blocks, and one or more lower metal layers which are patterned in conductive paths to carry signals of the circuitry.

Figure 5:
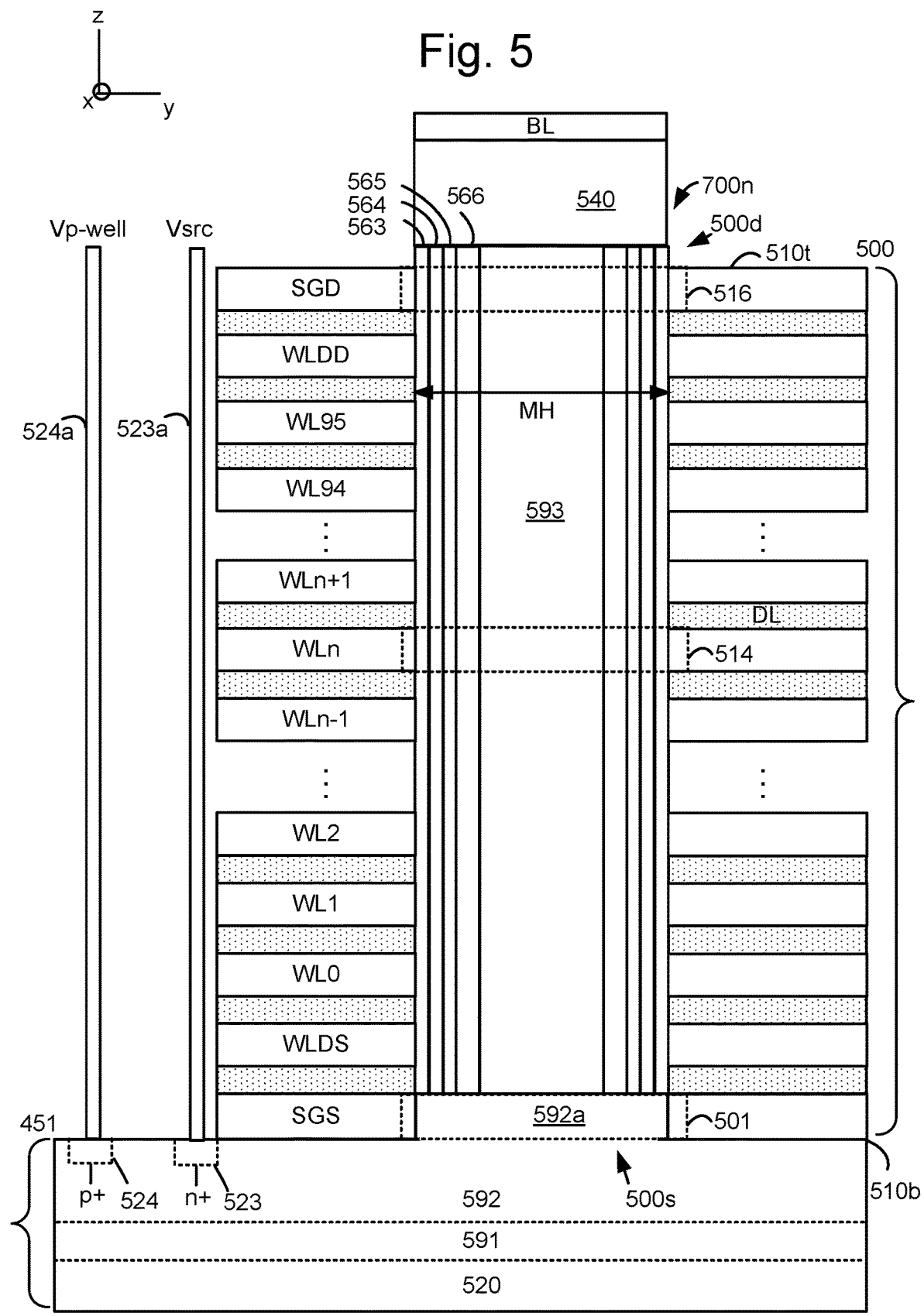
FIG. 5 depicts an example cross-sectional view of a portion of the block B0-0 of FIG. 4, including a NAND string 700n.

In this example, the memory cells are formed in vertical NAND strings in the blocks, consistent with FIG. 5. Each block comprises a stacked area of memory cells, where alternating levels of the stack represent word lines. In one possible approach, each block has opposing tiered sides from which vertical contacts extend upward to an upper metal layer to form connections to conductive paths. While two planes are depicted as an example, other examples can use four or more planes. One plane per die is also possible.

FIG. 5 depicts an example cross-sectional view of a portion of the block B0-0 of FIG. 4, including a NAND string 700*n*. The block comprises a stack 500 of alternating conductive layers (e.g., select gate layers and word line layers) and dielectric layers. The layers may be rectangular plates having a height in the z direction, a width in the y direction, and a length in the x direction. Example conductive layers include SGS, WLDS, WL0, WL1, WL2, . . . , WL*n*−1, WL*n*, WL*n*+1, WL94, WL95, WLDD and SGD.

WL*n* denotes a selected word line for a read or program operation. The dielectric layers are shown by a dotted pattern and include an example dielectric layer DL. The conductive layers extend in a memory hole MH (see also FIG. 6).

The stack is depicted as comprising one tier but can optionally include one or more tiers of alternating conductive and dielectric layers. A stack comprises a set of alternating conductive and dielectric layers in which a memory hole is formed in a fabrication process.

The conductive layers comprise SGS, WLDS, WL0-WL95, WLDD and SGD(0), in addition to 96 data word lines in this example, although the number of data word lines could be greater or less than 96.

The conductive layers connected to control gates of memory cells are referred to as word lines, and the conductive layers connected to control gates of source-side select gate transistors and drain-side select gate transistors are referred to as source-side and drain-side control lines, respectively. WLDS and WLDD are dummy word lines or conductive layers connected to dummy memory cells. A dummy memory cell may have the same construction as a data memory cell but is considered by the controller to be ineligible to store any type of data including user data. One or more dummy memory cells may be provided at the drain and/or source ends of a NAND string of memory cells to provide a gradual transition in the channel voltage gradient. WL0-WL95 are data word lines connected to data memory cells, which are eligible to store user data.

A top 510*t* and bottom 510*b* of the stack are depicted. WL95 is the topmost data word line and WL0 is the bottommost data word line.

The NAND strings are formed by etching memory holes in the stack, then depositing multiple thin layers of materials along the sidewalls of the memory holes. Memory cells are formed in a region in which the word lines intersect with the multiple thin layers, and select gate transistors are formed in regions in which the SGS and SGD control lines intersect with the multiple thin layers. For example, a drain-side select gate transistor 516 is formed where the SGD control line intersects with the multiple thin layers, a source-side select gate transistor 501 is formed where the SGS control line intersects with the multiple thin layers, and a selected memory cell 514 is formed where WL*n* intersects with the multiple thin layers.

The multiple thin annular layers can be deposited, e.g., using atomic layer deposition. For example, the layers can include a blocking oxide layer 563, a charge-trapping layer 564 or film such as silicon nitride (Si3N4) or other nitride, a tunneling layer 565 (e.g., a gate oxide) and a channel layer 566 (e.g., comprising polysilicon). A dielectric core 593 (e.g., comprising silicon dioxide) can also be provided. In this example, all of the layers are provided in the memory hole. In other approaches, some of the layers can be provided in the word line or control line layer. The multiple thin layers form a columnar active area of a NAND string. A word line or control line can comprise a metal such as Tungsten.

The stack is formed on the substrate 451. In one approach, the substrate includes a p-well region 592 connected to the source ends of the NAND strings. The p-well region may comprise an epitaxial region 592*a* which extends upward adjacent to the SGS layer. The p− well region can include an n+ contact 523 connected to a local interconnect 523*a* (a conductive path or source line) for receiving Vsrc, and a p+ contact 524 connected to a conductive path 524*a* for receiving Vp-well. The local interconnect and conductive path can comprise a conductive material such as metal surrounded by an insulating material to prevent conduction with the metal of the adjacent word lines. The p-well region 592 can be formed in an n-well 591, which in turn is formed in a p-type semiconductor region 520 of the substrate, in one possible implementation.

The NAND string 700n has a source end 500s at a bottom 510b of the stack 500, connected to the p-well. The NAND string 500n also has a drain end 500d at a top 510t of the stack, connected to a bit line BL0 via a bit line contact 540 comprising an n-type material.

The NAND string in this 3D configuration is considered to have a floating body channel because the length of the channel is not formed on a substrate.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the channels of the NAND string are charged up, such as by applying a positive erase pulse to the substrate, causing the electrons to return to the channel from the charge trapping layer.

Figure 6:
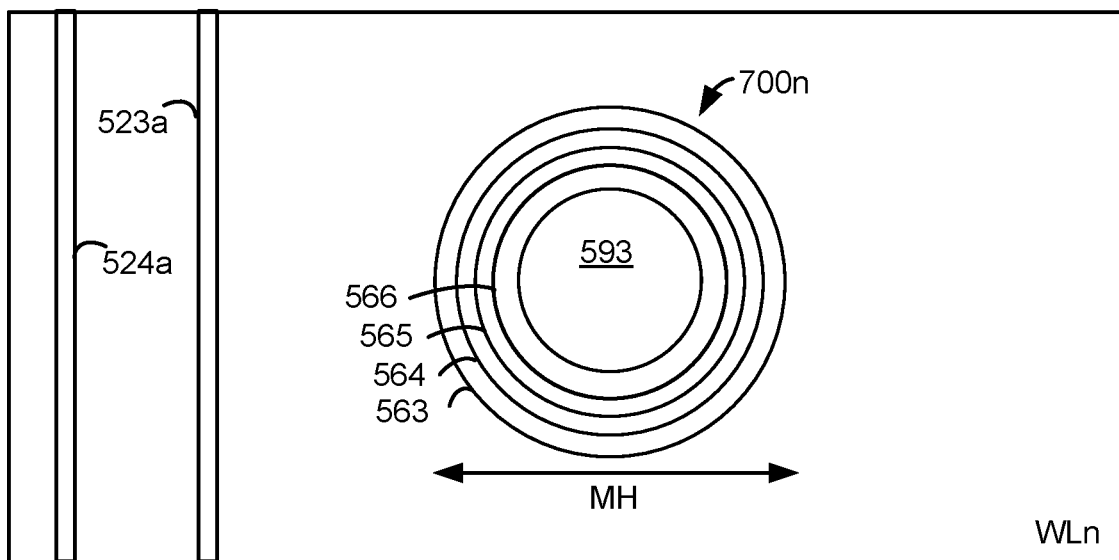
FIG. 6 depicts an example cross-sectional view of the block portion of FIG. 5 in the x-y plane at the level of WLn.

FIG. 6 depicts an example cross-sectional view of the block portion of FIG. 5 in the x-y plane at the level of WLn. The layers of the NAND string 700n are depicted, including the blocking oxide layer 563, charge-trapping layer 564, tunneling layer 565 and the channel layer 566. The dielectric core 593 is also depicted.

Figure 7:
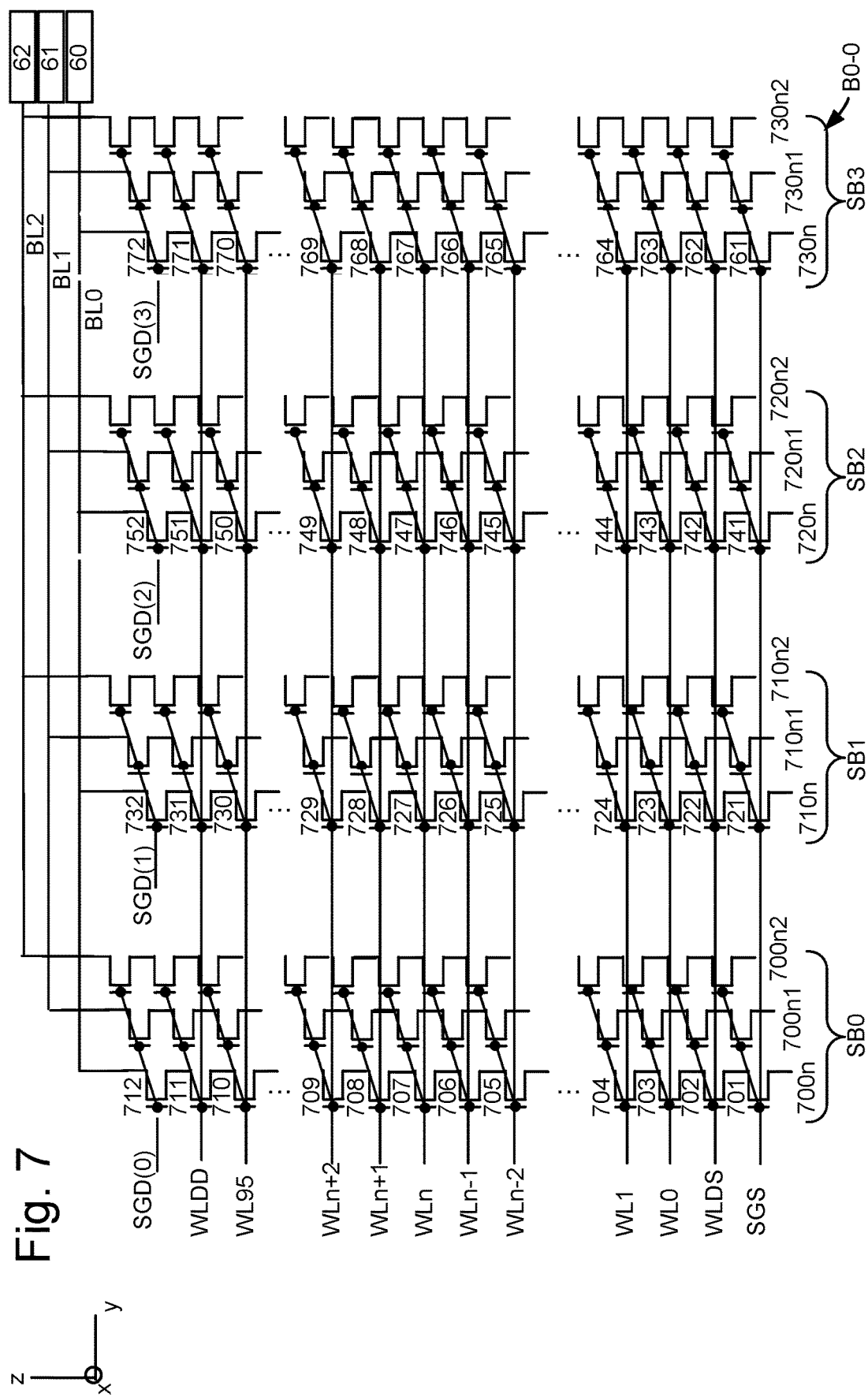
FIG. 7 depicts an example view of the block B0-0 of FIG. 4, with respective NAND strings arranged in sub-blocks, along with associated bit lines and sense circuits.

FIG. 7 depicts an example view of the block B0-0 of FIG. 4, with respective NAND strings arranged in sub-blocks, along with associated bit lines and sense circuits. The set of word lines WL0-WL95 are connected to memory cells arranged in NAND strings. The NAND strings are arranged in sub-blocks of the block in a 3D configuration. The block is consistent with FIGS. 4 to 6. Each sub-block SB0-SB3 includes multiple NAND strings. Three example NAND strings are depicted, as a simplification. For example, SB0 comprises NAND strings 700n, 700n1 and 700n2, SB1 comprises NAND strings 710n, 710n1 and 710n2, SB2 comprises NAND strings 720n, 720n1 and 720n2, and SB3 comprises NAND strings 730n, 730n1 and 730n2. The NAND strings have data word lines, dummy word lines and select gate lines. Each sub-block comprises a set of NAND strings which extend in the x direction and which have a common SGD line or control gate layer. In particular, SGD(0)-SGD(3) are in SB0-SB3, respectively.

Programming of the block may occur based on a word line programming order. One option is to program the memory cells in different portions of a word line which are in the different sub-blocks, one sub-block at a time, before programming the memory cells of the next word line. For example, this can involve programming WL0 in SB0, SB1, SB2 and then SB3, then programming WL1 in SB0, SB1, SB2 and then SB3, and so forth. In one option, referred to as a regular programming order, the word line programming order may start at WL0, the source end word line and end at WL95, the drain end word line, for example. In another option, referred to as a reverse programming order, the programming starts from the highest word line, e.g., WL95, and ends at the lowest word line, e.g., WL0. This option can reduce neighbor word line interference.

Reading can occur for memory cells connected to a selected word line in a selected sub-block. Reading can occur one sub-block at a time.

In an erase operation, typically the entire block is erased, although a partial block erase is also possible.

Each NAND string comprises a plurality of memory cells between an SGS transistor and a SGD transistor, in this example. In other examples, more than one SGD and/or SGS transistor can be provided for each NAND string. The number of dummy memory cells can also vary. For example, the NAND string 700n includes an SGS transistor 701, a dummy memory cell 702, data memory cells 703-710, a dummy memory cell 711 and an SGD transistor 712. The NAND string 710n includes an SGS transistor 721, a dummy memory cell 722, data memory cells 723-730, a dummy memory cell 731 and an SGD transistor 732. The NAND string 720n includes an SGS transistor 741, a dummy memory cell 742, data memory cells 743-750, a dummy memory cell 751 and an SGD transistor 752. The NAND string 730n includes an SGS transistor 761, a dummy memory cell 762, data memory cells 763-770, a dummy memory cell 771 and an SGD transistor 772.

This example depicts one SGD transistor at the drain end of each NAND string, and one SGS transistor at the source end of each NAND string. The SGD transistors in SB0, SB1, SB2 and SB3 may be driven by separate control lines SGD(0), SGD(1), SGD(2) and SGD(3), respectively, in one approach. In another approach, multiple SGD and/or SGS transistors can be provided in a NAND string.

A set of bit lines, including example bit lines BL0-BL2, are connected to the NAND strings. Each bit line is connected to a respective set of NAND strings, including one NAND string in each sub-block. For example, BL0 is connected to NAND strings 700n, 710n, 720n and 730n in SB0-SB3, respectively, BL1 is connected to NAND strings 700n1, 710n1, 720n1 and 730n1 in SB0-SB3, respectively, and BL2 is connected to NAND strings 700n2, 710n2, 720n2 and 730n2 in SB0-SB3, respectively. Each bit line is also connected to a respective sense circuit, consistent with the sense circuits of FIG. 2. For example, BL0-BL2 are connected to sense circuits 60-62, respectively.

Figure 8:
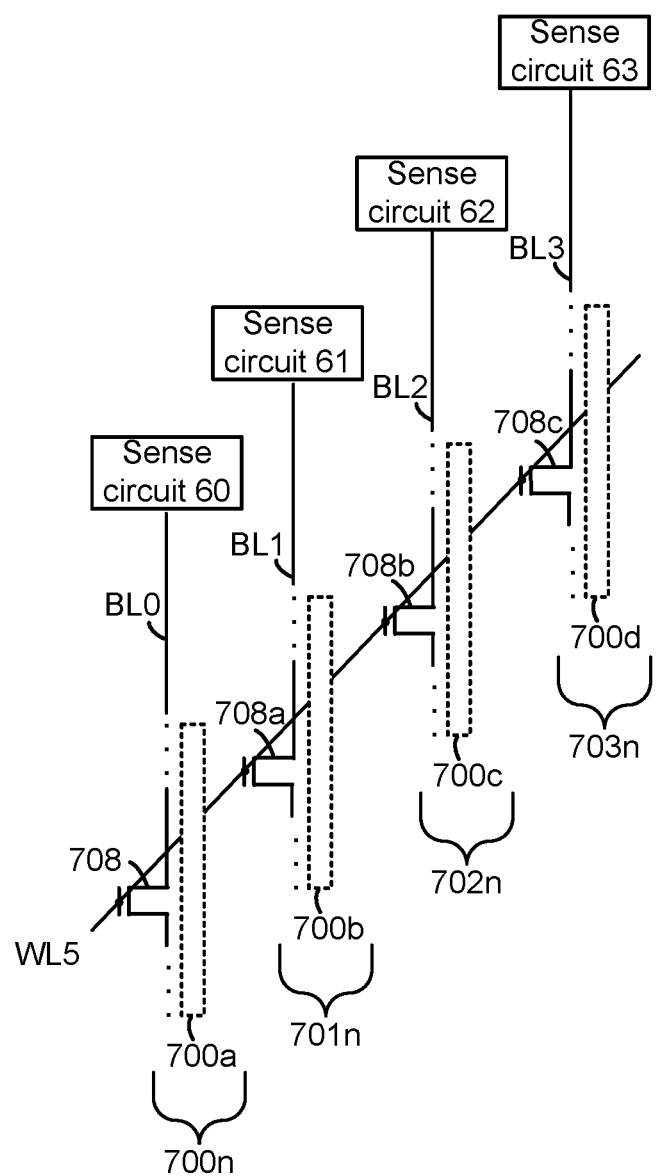
FIG. 8 depicts an example view of memory cells connected to WL5 in the sub-block SB0 of FIG. 7, with respective NAND strings, bit lines and sense circuits.

FIG. 8 depicts an example view of memory cells connected to WL5 in the sub-block SB0 of FIG. 7, with respective NAND strings, bit lines and sense circuits. The memory cell 708 and channel 700a of the NAND string 700n in SB0 of FIG. 7 are depicted, along with a respective bit line BL0. SB0 also includes memory cells 708a, 708b and 708c in NAND strings 701n, 702n and 703n, respectively, which have channels 700b, 700c and 700d, respectively, and which are connected to bit lines BL1, BL2 and BL3, respectively. The bit lines BL0-BL3 are connected to the sense circuits 60-63, respectively, of FIG. 2.

In a program loop, the memory cells 708 and 708a could be examples of selected memory cells, respectively, in which case the NAND strings 700n and 701n are examples of selected NAND strings. A bit line voltage which enables programming, e.g., 0 V, is applied to these bit lines when a program pulse is applied. The memory cells 708b and 708c could be examples of unselected memory cells, respectively, in which case the NAND strings 702n and 703n are examples of unselected NAND strings. A bit line voltage which inhibits programming, e.g., 1.5 V, is applied to these bit lines when a program pulse is applied.

Figure 9:
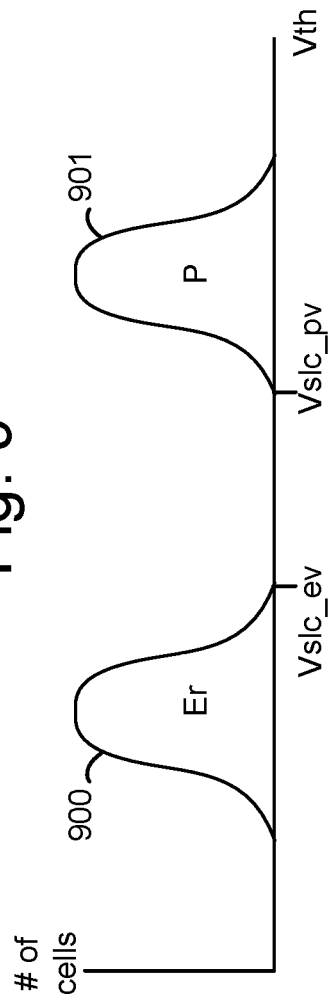
FIG. 9 depicts a Vth distribution for a set of SLC memory cells.

FIG. 9 depicts a Vth distribution for a set of SLC memory cells. The erased (Er) state is represented by the Vth distribution 900, and the programmed state (P) is represented by the Vth distribution 901. The Er state is obtained by using an erase-verify voltage, Vslc_ev, and the P state is obtained using a program-verify voltage, Vslc_pv.

During an erase operation, the Vth of the memory cells is set below the erase-verify voltage. The erase operation is completed when all or nearly all of the memory cells have a Vth below this voltage. During the program operation, the Vth of the memory cells is set above a program-verify voltage. The program operation is completed when all or nearly all of the memory cells have a Vth above this voltage.

Figure 10:
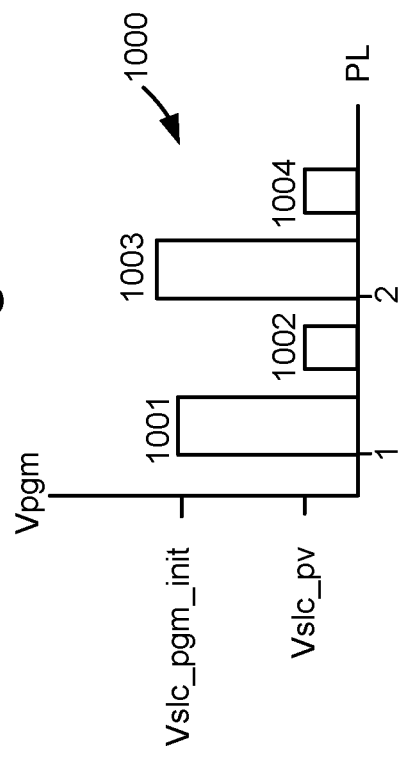
FIG. 10 depicts an example voltage signal 1000 applied to a selected word line in an SLC program operation, consistent with FIG. 9.
Figure 12:
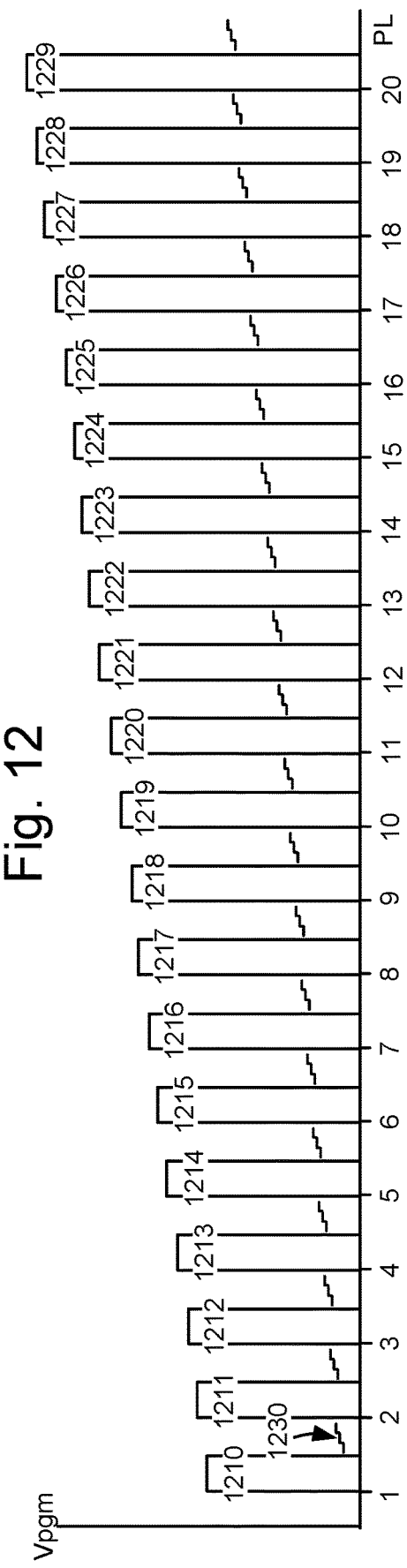
FIG. 12 depicts an example voltage signal 1200 applied to a selected word line in an MLC program operation, consistent with FIG. 11.

FIG. 10 depicts an example voltage signal 1000 applied to a selected word line in an SLC program operation, consistent with FIG. 9. In FIGS. 10 and 12, the vertical axis depicts a number of memory cells on a logarithmic scale, and the horizontal axis depicts a Vth of the memory cells on a linear scale.

In a first program loop, a program pulse 1001 with a magnitude of Vslc_pgm_init is applied to the selected word line, followed by a verify pulse 1002 with a magnitude of Vslc_pv. In a second program loop, a program pulse 1003 is applied to the selected word line followed by a verify pulse 1004 with the magnitude of Vslc_pv. The program pulses can increase by a step size. In this example, the program operation is completed in the second program loop. SLC programming generally can be completed in a relatively small number of program loops, e.g., one, two or more loops, compared to MLC programming, since a wider Vth distribution for the programmed state, and a larger spacing between the erased state and the programmed state, are acceptable.

Figure 11:
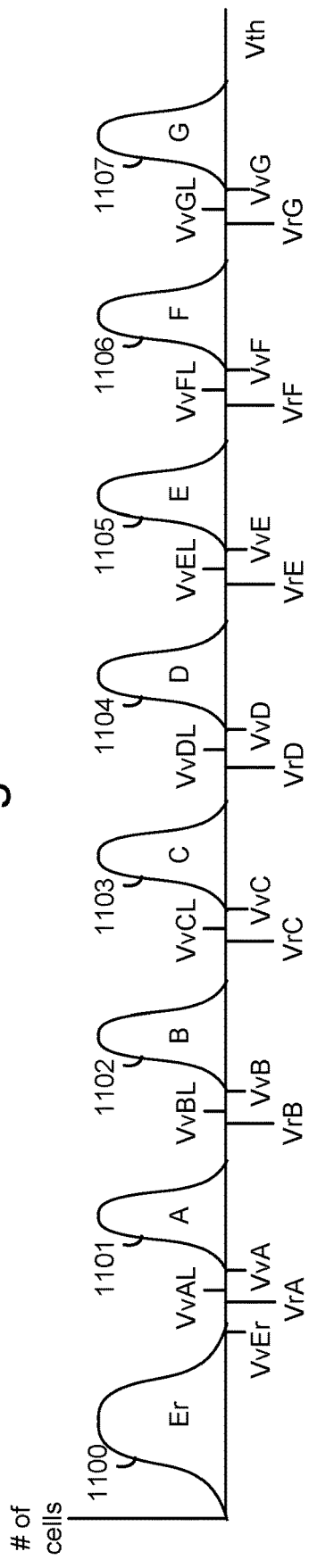
FIG. 11 depicts a Vth distribution of a set of memory cells with three bits per cell and eight data states.

FIG. 11 depicts a Vth distribution of a set of memory cells with three bits per cell and eight data states. Each memory cell may be associated with a data state according to write data in a program command. Based on its data state, a memory cell will either remain in the erased (Er) state or be programmed to a programmed data state. For example, in a one bit per cell memory device, there are two data states including the erased state and the programmed state. In a two-bit per cell memory device, there are four data states including the erased state and three programmed data states referred to as the A, B and C data states. In a three-bit per cell memory device, there are eight data states including the erased state and seven programmed data states referred to as the A, B, C, D, E, F and G data states. In a four-bit per cell memory device, there are sixteen data states including the erased state S0 and fifteen programmed data states S1-S15. Each data state can be represented by a range of threshold voltages (Vth) in the memory cells.

After the memory cells are programmed, the data can be read back in a read operation. A read operation can involve applying a series of read voltages to a word line while sensing circuitry determines whether cells connected to the word line are in a conductive (turned on) or non-conductive (turned off) state. If a cell is in a non-conductive state, the Vth of the memory cell exceeds the read voltage. The read voltages are set at levels which are expected to be between the threshold voltage levels of adjacent data states. Moreover, during the read operation, the voltages of the unselected word lines are ramped up to a read pass level or turn on level which is high enough to place the unselected memory cells in a strongly conductive state, to avoid interfering with the sensing of the selected memory cells. A word line which is being programmed or read is referred to as a selected word line, WLn.

In one approach, at a start of a program operation, the memory cells are all initially in the erased (Er) state, as represented by the Vth distribution 1100. After the program operation is successfully completed, the memory cells assigned to the A-G states are represented by the Vth distributions 1101-1107.

The memory cells which are programmed to the A-G states using final verify voltages (Vverify) of VvA-VvG, respectively, are represented by the Vth distributions 1101-1107, respectively. These Vth distributions are obtained just after completion of the program operation, and assume no program disturb or neighbor word line interference has occurred. The verify voltages are used in the program-verify tests of the memory cells. Optionally, offset verify voltages can also be used which are lower than the final verify voltage of a data state. For example, the offset verify voltages for the A-G states are VvAL-VvGL, respectively. When a memory cell has a Vth between the offset verify voltage and the final verify voltage of its assigned data state, it is programmed with a reduced programming speed by applying an elevated bit line voltage such as 0.7 V during a program pulse. This is also referred to as a slow programming mode or quick pass write (QPW) mode. The elevated bit line voltage is less than the inhibit bit line voltage. See also FIG. 14 which depicts a verify test for the A state using the offset verify voltage VvAL and the final verify voltage VvA.

Read voltages VrA-VrG can be used for reading the states of the memory cells in a read operation.

In an erase operation, the data memory cells transition from the Vth distributions of the programmed data states, e.g., states A-G, to the erased state. The erase operation includes an erase phase in which the memory cells are biased for erasing followed by an erase-verify test. The erase-verify test can use an erase-verify voltage, VvEr, which is applied to the word lines.

The Er-G states are examples of assigned data states, and the A-G states are examples of programmed data states, in this eight-state example.

FIG. 12 depicts an example voltage signal 1200 applied to a selected word line in an MLC program operation, consistent with FIG. 11. TLC (three-level cell) programming, with three bits per cell, and eight data states, is provided as an example. Other types of MLC programming can be used. In this example, the voltage signal includes twenty program loops PL1-PL20 with program pulses 1210-1229, respectively, and associated verify voltages. For example, verify voltages (plot 1230) are provided in PL1. The verify voltages are depicted in a simplified form, and can be provided for progressively higher data states as the programming proceeds. The program pulses can increase by a step size.

The voltages signals for programming in the MLC mode are similar to those in the SLC mode, except the verify voltages are for the programmed MLC states, and multiple verify voltages can be used in one program loop.

Figure 13:
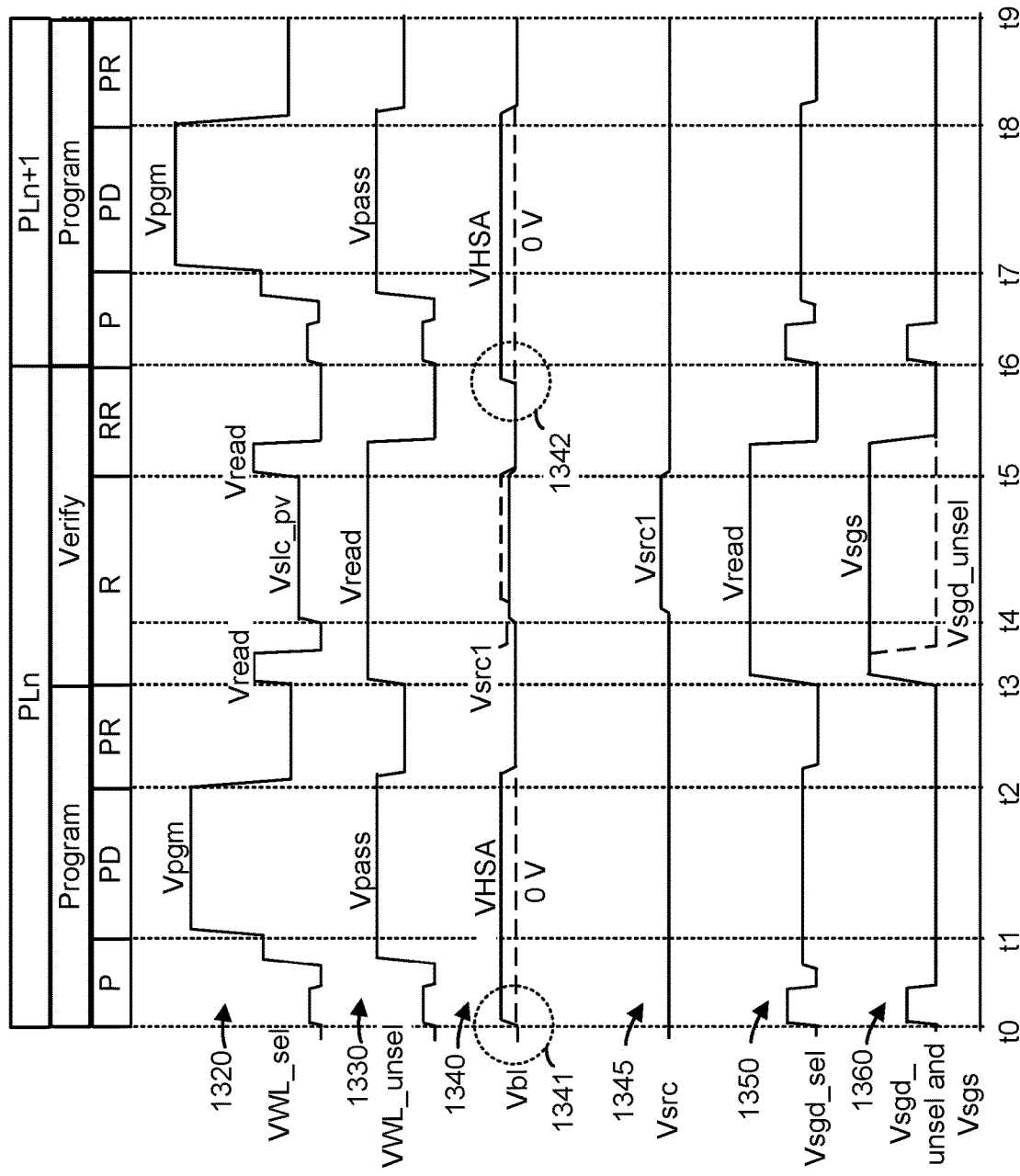
FIG. 13 depicts example voltage signals in nth and n+1st program loops of an SLC program operation, consistent with FIG. 10.

FIG. 13 depicts example voltage signals in nth and n+1st program loops of an SLC program operation, consistent with FIG. 10. Each program loop includes a program portion and a verify portion. Various time periods are depicted in the program and verify portions. For example, in the nth program loop, PLn, the program portion comprises time periods P (a pre-charge phase) from t0-t1, PD (a program phase in which a program pulse Vpgm is applied) from t1-t2 and PR (a program recovery phase) from t2-t3. The verify portion comprises time periods R (a word line ramp up and verify phase) from t3-t5 and RR (a recovery phase) from t5-t6. In the n+1st program loop, PLn+1, the program portion comprises time periods P from t6-t7, PD from t7-t8 and PR from t8-t9. The verify portion of PLn+1 is not depicted but is analogous to the verify portion of PLn.

A plot 1320 depicts a selected word line voltage, VWL_sel, a plot 1330 depicts an unselected word line voltage, VWL_unsel, a plot 1340 depicts a bit line voltage, Vbl, a plot 1345 depicts a source line voltage, Vsrc, a plot 1350 depicts a selected SGD transistor voltage, Vsgd_sel, and a plot 1360 depicts an unselected SGD transistor voltage, Vsgd_unsel, and a SGS transistor voltage, Vsgs.

In PLn, VWL_sel increases to a small positive level just after t0 to allow channel pre-charging. A program pulse at a level of Vpgm is then applied, and a recovery period follows. Subsequently, VWL_sel may be spiked up to Vread, lowered to 0 V and then increased to Vslc_pv for the verify test. VWL_sel may be spiked up an additional time to Vread, and then lowered to 0 V at the end of PLn. The Vread spike before the verify test helps drain out residue electrons from the channels of the unselected NAND strings in the unselected sub-blocks. The Vread spike after the verify test is a channel clean voltage which equalizes the channel potential.

A similar pattern is repeated in PLn+1. VWL_unsel increases to a small positive level just after t6 to allow channel pre-charging and then increases to Vpass when the program pulse is applied. A recovery follows.

During the pre-charge, Vbl is ramped up from an initial level to a higher level, VHSA, for unselected NAND strings and kept a lower level such as 0 V for selected NAND strings. This allows the pre-charge to occur in unselected NAND strings. Similarly, during the verify test, Vbl is increased to a positive voltage, Vsrcl, for the unselected bit lines and to a higher level than Vsrcl for the selected bit lines. Vbl is increased at t4 in PLn for the verify portion of PLn. Vsrcl is applied to the source line. With Vsrcl at the source end and the drain end of the unselected NAND strings, no current will flow to the sense amp. In contrast, a current can flow in a selected NAND string, if the selected memory cell is conductive, when the drain has a higher bias than the source.

In the verify tests, Vbl is set to a level such as Vsense, e.g., 0.5 V, for selected NAND strings. A similar pattern is repeated in PLn+1. The regions 1341 and 1342 denote portions of the bit line voltage signal in which the peak current can be problematic. The techniques discussed herein, including optimizing VHSASLOW and VHSATGT based on the number of bits per cell being programmed in the program operation, allow the ramp up to occur as quickly as possible while keeping the peak current below a specified limit. VHSASLOW is a parameter that controls the regulated ramp up rate for the unselected bit lines, and VHSATGT is a parameter that controls the target or final voltage of the regulated ramp up.

The peak current can also be problematic when VWL_unsel is ramped up to Vread during the verify tests.

Additionally, note that the ramp up of Vbl to VHSA for the unselected bit lines in PLn+1 can occur at the end of PLn, just before t6, in a process referred to as dynamic inhibit.

During the pre-charge, Vsgd_sel is elevated and Vbl_sel=0 V to provide the SGD transistor in a conductive state. Vsgd_sel is then returned to a lower level during the program pulse so that the SGD_sel transistor will be on or off if Vbl is low or high, respectively. With Vbl=Vbl_inh, the SGD transistors of the unselected NAND strings will be in a non-conductive state to inhibit programming.

Vsgd_unsel and Vsgs are elevated during the pre-charge to provide the SGD and SGS transistors in a conductive state, and then returned to 0 V during the program pulse. During the verify test, Vsgd_sel and Vsgs are set to Vread to provide the corresponding transistors in a conductive state to allow sensing to occur. Vsgd_unsel is spiked up to Vread at t3 and then kept at 0 V while Vbl_inh is set to provide the corresponding SGD transistors in a non-conductive state, to avoid interfering with the sensing of the selected NAND strings. The spiking of Vsgd_unsel to Vread helps drain out residue electrons from the channels of the unselected NAND strings in the unselected sub-blocks.

Figure 14:
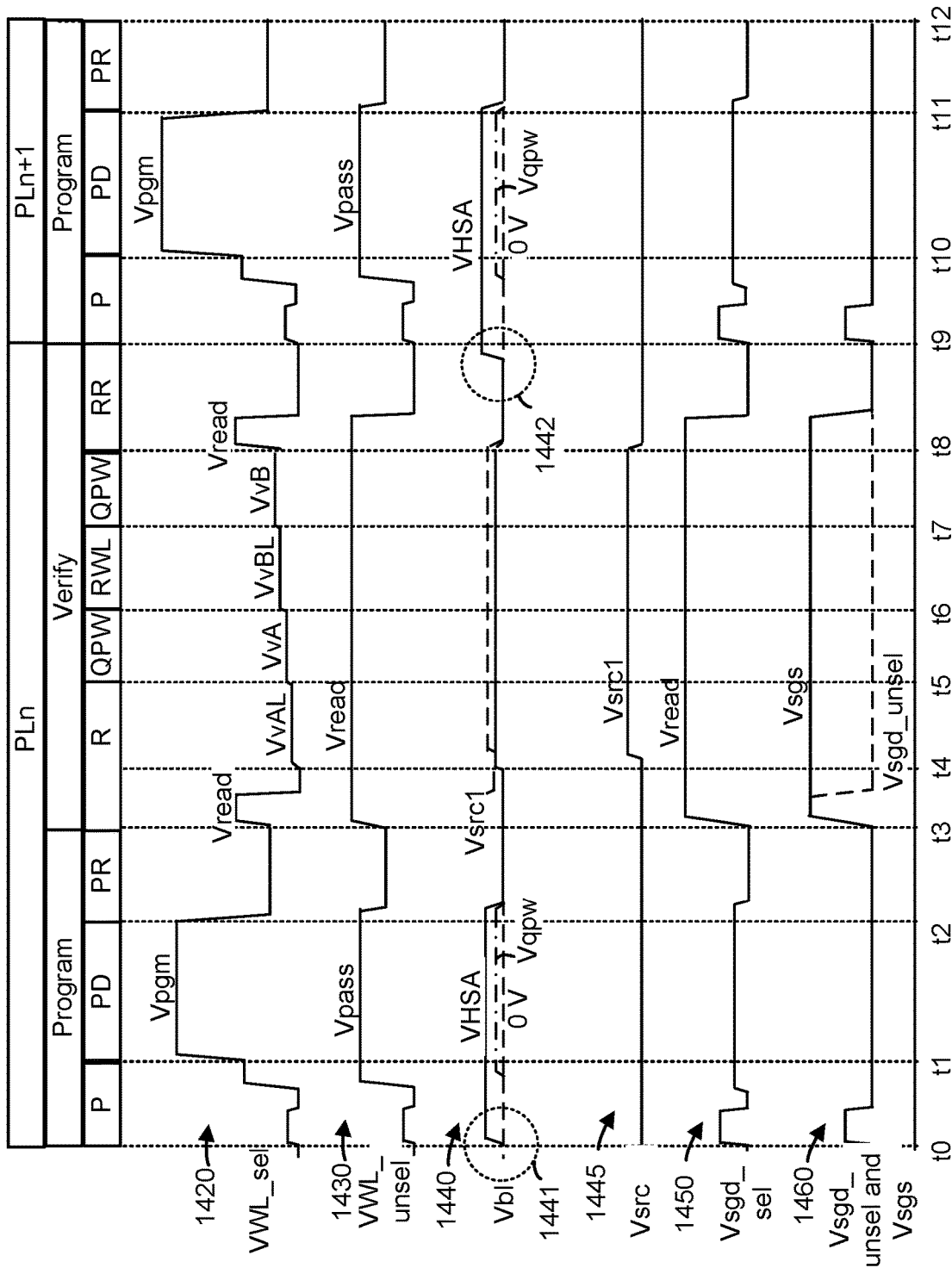
FIG. 14 depicts example voltage signals in nth and n+1st program loops of an MLC program operation, consistent with FIG. 12.

FIG. 14 depicts example voltage signals in nth and n+1st program loops of an MLC program operation, consistent with FIG. 12. Along with the program and verify portions of PLn, the program portion of PLn+1 is shown. The verify portion in PLn+1 is not depicted but is analogous to the verify portion in PLn. The voltage signals are analogous to those in FIG. 13 except for the verify tests. In this example, verify tests using VvAL and VvA are done in PLn. As discussed in connection with FIG. 11, VvAL is an offset verify voltage of the A state and VvA is a final verify voltage of the A state. Verify tests for other data states could be performed as well. The regions 1441 and 1442 denote portions of the bit line voltage signal in which the peak current can be problematic.

In PLn, the program portion comprises time periods P from t0-t1, PD from t1-t2 and PR t2-t3. The verify portion comprises time periods R from t3-t5, QPW from t5-t6, RWL from t6-t7, QPW from t7-t8 and RR from t8-t9. In PLn+1, the program portion comprises time periods P from t9-t10, PD from t10-t11 and PR from t11-t12.

A plot 1420 depicts VWL_sel, a plot 1430 depicts VWL_unsel, a plot 1440 depicts Vbl, a plot 1445 depicts Vsrc, a plot 1450 depicts Vsgd_sel, and a plot 1460 depicts Vsgd_unsel and Vsgs. Vbl is increased at t4 in PLn for the verify portion.

In this example, two verify tests are performed for the A state using two word line voltages, VvAL and VvA, and two verify tests are performed for the B state using two word line voltages, VvBL and VvB, in a process referred to as quick pass write (QPW). This term is based on the ability to quickly program the memory cells in a program pass. The memory cells are programmed quickly initially and then slowed down as their Vth approaches the final verify voltage. However, performance is not optimized due to the time used to stabilize VWL_sel when transitioning from VvAL to VvA or from VvBL to VvB. Another approach involves a fast or intelligent QPW, referred to as iQPW. In this approach, for each state, a single word line voltage is applied while the two verify tests are performed in turn. The sense node is charged up to a higher level and a sensing operation is performed which indicates the Vth of the cell relative to the lower, offset verify voltage of a data state (e.g., VvAL or VvBL). The sensing operation involves discharging the sense node to a lower level. Subsequently, without charging up the sense again, a sensing operation is performed which indicates the Vth of the cell relative to the higher, final verify voltage of the data state (e.g., VvA or VvB).

Figure 15A:
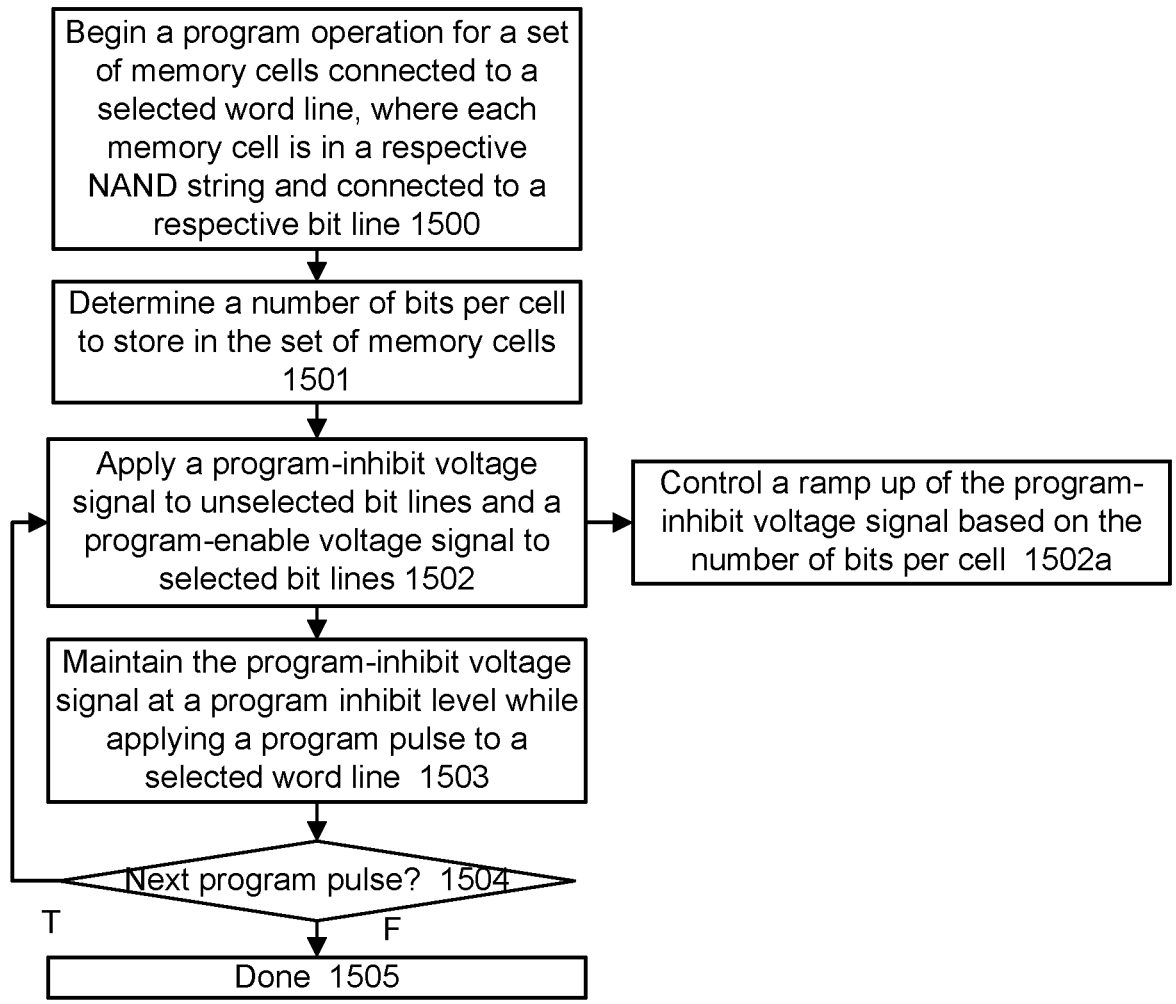
FIG. 15A depicts a flowchart of a process for controlling a bit line pre-charge voltage in a program operation based on a number of bits per cell.

FIG. 15A depicts a flowchart of a process for controlling a bit line pre-charge voltage in a program operation based on a number of bits per cell. Step 1500 begins a program operation for a set of memory cells connected to a selected word line, where each memory cell is in a respective NAND string and is connected to a respective bit line. Step 1501 includes determining a number of bits per cell to store in the set of memory cells. For example, this can involve determining whether a block is in an SLC or MLC mode. The SLC or MLC mode, or other indication of the number of bits per call, can be determined by a mode which is set for a block by a controller. Different blocks in a memory device can have different modes. Step 1502 includes applying a program-inhibit voltage signal to unselected bit lines and a program-enable voltage signal to selected bit lines. The unselected bit lines are bit lines connected to unselected NAND strings and the selected bit lines are bit lines connected to selected NAND strings. Unselected NAND strings include memory cells selected for programming and unselected NAND strings do not include memory cells selected for programming. Step 1502 can be implemented using step 1502*a* which includes controlling a ramp up of the program-inhibit voltage signal based on the number of bits per cell.

Step 1503 includes maintaining the program-inhibit voltage signal at a program inhibit level while applying a program pulse to the selected word line. A decision step 1504 determines whether there is a next program pulse in the program operation. If the decision step is true (T), step 1502 is repeated in a next program loop. If the decision step is false (F), the process is done at step 1505.

Figure 15B:
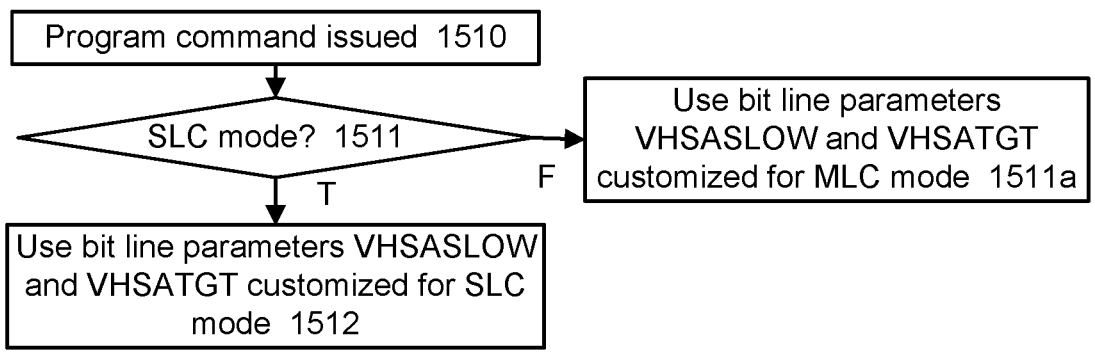
FIG. 15B depicts a flowchart of a process consistent with FIG. 15A for controlling a bit line pre-charge voltage in a program operation separately for SLC and MLC programming.

FIG. 15B depicts a flowchart of a process consistent with FIG. 15A for controlling a bit line pre-charge voltage in a program operation separately for SLC and MLC programming. At step 1510, a program command is issued. A decision step 1511 determines whether the program command is for memory cells in an SLC mode. If the decision step 1511 is true, step 1512 includes using bit line parameters VHSASLOW and VHSATGT which are customized for the SLC mode. VHSASLOW is a regulated ramp up rate and VHSATGT is a target voltage of the regulated ramp up. If the decision step 1511 is false, step 1511*a* includes using the bit line parameters VHSASLOW and VHSATGT which are customized for the MLC mode. The parameters can also be customized for different MLC modes, such as 2, 3, 4 or 5 bits per cell.

Figure 15C:
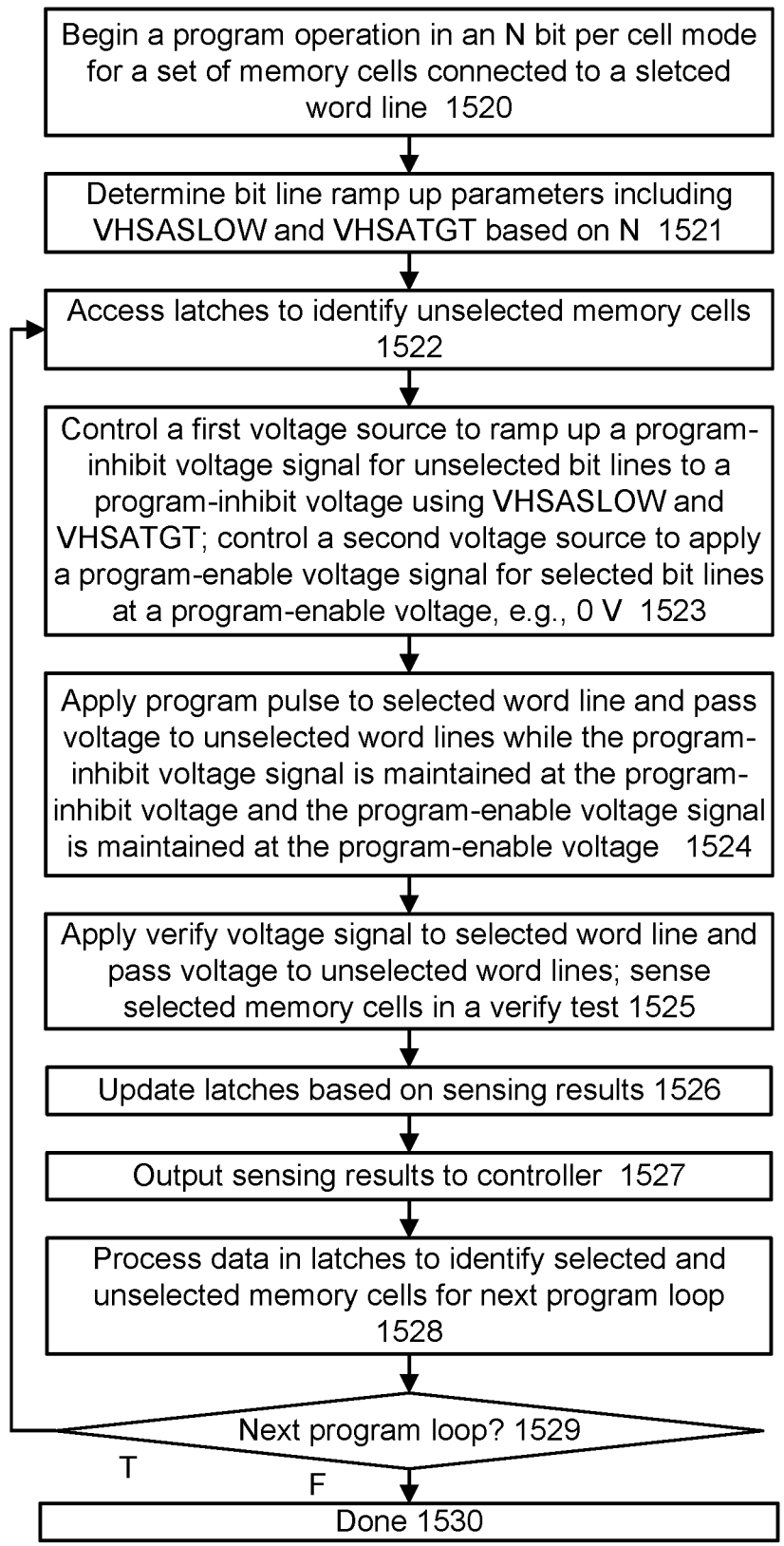
FIG. 15C depicts a flowchart of example implementation details of a program operation consistent with FIG. 15A.

FIG. 15C depicts a flowchart of example implementation details of a program operation consistent with FIG. 15A. Step 1520 begins a program operation in an N bit per cell mode for a set of memory cells connected to a selected word line, where N is one or more. Step 1521 includes determining bit line ramp up parameters including VHSASLOW and VHSATGT based on N. See FIGS. 20A and 20B, for example. Step 1522 includes accessing latches (FIG. 2) to identify unselected memory cells among the set of memory cells. Step 1523 includes controlling a first voltage source (440*a*, FIG. 2) to ramp up a program-inhibit voltage signal for unselected bit lines to a program-inhibit voltage, e.g., 1.5 V, using VHSASLOW and VHSATGT, and controlling a second voltage source (440*b*, FIG. 2) to apply a program-enable voltage signal for selected bit lines at a program-enable voltage, e.g., 0 V.

Step 1524 includes applying a program pulse to the selected word line and a pass voltage to unselected word lines while the program-inhibit voltage signal is maintained at the program-inhibit voltage and the program-enable voltage signal is maintained at the program-enable voltage. Step 1525 includes applying a verify voltage signal to the selected word line and a pass voltage to unselected word lines, and sensing the selected memory cells in a verify test. For SLC programming, a single verify test is performed. For MLC programming, one or more verify tests are performed. Step 1526 includes updating the latches based on the sensing results. The memory cells which complete programming have their latches updated so that these memory cells are inhibited from programming in a next program loop. Step 1527 includes outputting the sensing results to a controller.

At step 1528, the controller processes the data in the latches to identify selected and unselected memory cells for a next program loop, if applicable. A decision step 1529 determines whether there is a next program loop, e.g., whether programming is not yet completed for all or nearly all of the selected memory cells. If the decision step 1529 is true, the process starting at step 1522 is repeated in a next program loop. If the decision step 1529 is false, the process is done at step 1530.

Figure 16A:
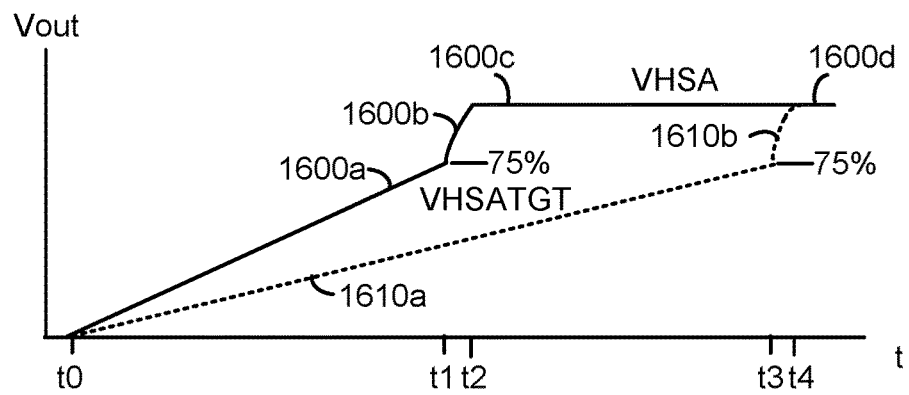
FIG. 16A depicts example bit line voltage signals, showing different regulated ramp up rates and a common target voltage, consistent with regions 1341 and 1342 in FIG. 13, regions 1441 and 1442 in FIG. 14 and FIG. 15A-15C.
Figure 16B:
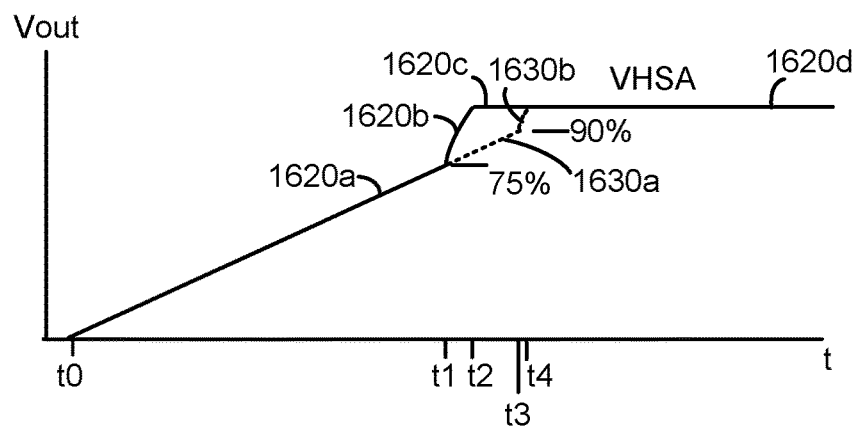
FIG. 16B depicts example bit line voltage signals, showing a common regulated ramp up rate and different target voltages, consistent with regions 1341 and 1342 in FIG. 13, regions 1441 and 1442 in FIG. 14 and FIG. 15A-15C.
Figure 16C:
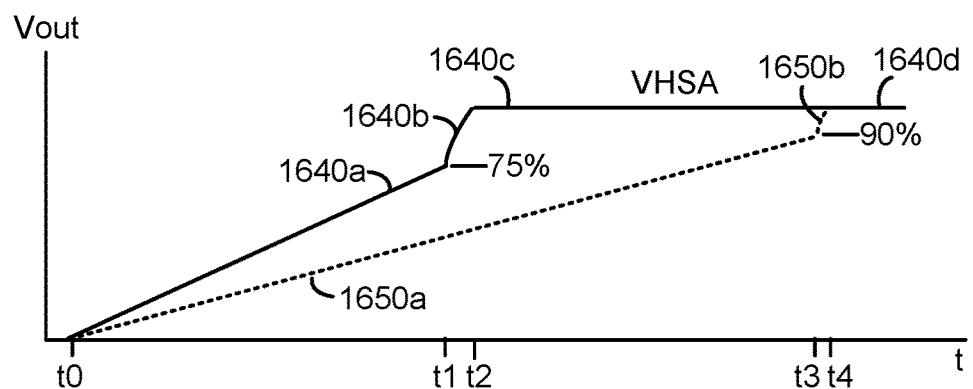
FIG. 16C depicts example bit line voltage signals, showing different regulated ramp up rates and different target voltages, consistent with regions 1341 and 1342 in FIG. 13, regions 1441 and 1442 in FIG. 14 and FIG. 15A-15C.

FIG. 16A depicts example bit line voltage signals, showing different regulated ramp up rates and a common target voltage, consistent with regions 1341 and 1342 in FIG. 13, regions 1441 and 1442 in FIG. 14 and FIG. 15A-15C. In FIG. 16A-16C, the vertical axis depicts Vout in FIG. 3B and the horizontal axis depicts a time scale which can differ in the three figures. In each of these figures, the program-inhibit bit line voltage signal can increase initially at a regulated rate by controlling the voltage source to incrementally increase the voltage in successive steps. When the program-inhibit voltage signal reaches a target voltage (VHSATGT), which is a specified percentage of the final voltage (VHSA), the program-inhibit voltage signal increases at an unregulated rate by controlling the voltage source to increase the voltage further to the final voltage, in one approach. Using a regulated rate over the majority of the ramp up time of the program-inhibit voltage signal helps avoid excessive current consumption, while allowing some increase at an unregulated rate avoids an excessive ramp up time.

Plots 1600*a*-1600*d* depict a program-inhibit voltage signal which increases at a relatively high rate, and plots 1610*a*, 1610*b* and 1600*d* depict a program-inhibit voltage signal which increases at a relatively low rate. In both cases, the voltage increase starts at t0. The regulated increase of plot 1600*a* continues until VHSATGT=75% is reached at t1. This is 75% of the peak, final voltage VHSA. An unregulated increase from VHSATGT=75% to VHSA occurs at t1-t2 (plot 1600*b*) and the final level is reached and maintained at t2-t4 plots (1600*c* and 1600*d*). The regulated increase of plot 1601*a* continues until VHSATGT=75% is reached at t3. An unregulated increase occurs at t3-t4 (plot 1610*b*) and the final level is reached and maintained at t3-t4 at plots 1600*d*.

Using a relatively low target voltage helps the program-inhibit voltage reach its final level sooner so that a further time savings is achieved, at a cost of higher current consumption. A control circuit can be configured to instruct the voltage source to output the voltage signal at a desired regulated ramp up rate and target voltage.

FIG. 16B depicts example bit line voltage signals, showing a common regulated ramp up rate and different target voltages, consistent with regions 1341 and 1342 in FIG. 13, regions 1441 and 1442 in FIG. 14 and FIG. 15A-15C. Plots 1620*a*-1620*d* depict a first program-inhibit voltage signal which reaches a respective VHSATGT and VHSA in a shorter time, at t1 and t2, respectively, and plots 1620*a*, 1630*a*, 1630*b* and 1620*d* depict a second program-inhibit voltage signal which reaches a respective VHSATGT and VHSA in a longer time, at t3 and t4, respectively. The regulated ramp up rate is the same for both signals. The first signal has a regulated increase from an initial voltage to VHSATGT=75% at t0-t1 (plot 1620*a*), then an unregulated increase from VHSATGT=75% to VHSA at t1-t2 (plot 1620*b*). The second signal has a regulated increase from the initial voltage to VHSATGT=90% at t0-t3 (plots 1620*a* and 1630*a*), then an unregulated increase from VHSATGT=90% to VHSA at t3-t4 (plot 1630*b*).

FIG. 16C depicts example bit line voltage signals, showing different regulated ramp up rates and different target voltages, consistent with regions 1341 and 1342 in FIG. 13, regions 1441 and 1442 in FIG. 14 and FIG. 15A-15C. Plots 1640*a*-1640*d* depict a first program-inhibit voltage signal which reaches a respective VHSATGT and VHSA in a shorter time, at t1 and t2, respectively, and plots 1650*a* and 1650b depict a second program-inhibit voltage signal which reaches a respective VHSATGT and VHSA in a longer time, at t3 and t4, respectively. The regulated ramp up rate is greater and the target voltage is lower for the first signal. The first signal has a regulated increase from an initial voltage to VHSATGT=75% at t0-t1 (plot 1640a), then an unregulated increase from VHSATGT=75% to VHSA at t1-t2 (plot 1640b). The second signal has a regulated increase from the initial voltage to VHSATGT=90% at t0-t3 (plot 1650a), then an unregulated increase from VHSATGT=90% to VHSA at t3-t4 (plot 1650b).

Figure 17B:
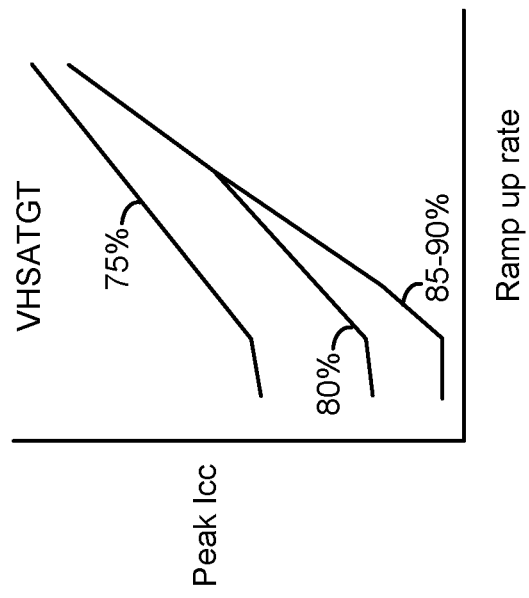
FIG. 17B depicts a plot of peak current consumption as a function of a ramp up rate and a target voltage, consistent with FIG. 16A-16C.
Figure 17A:
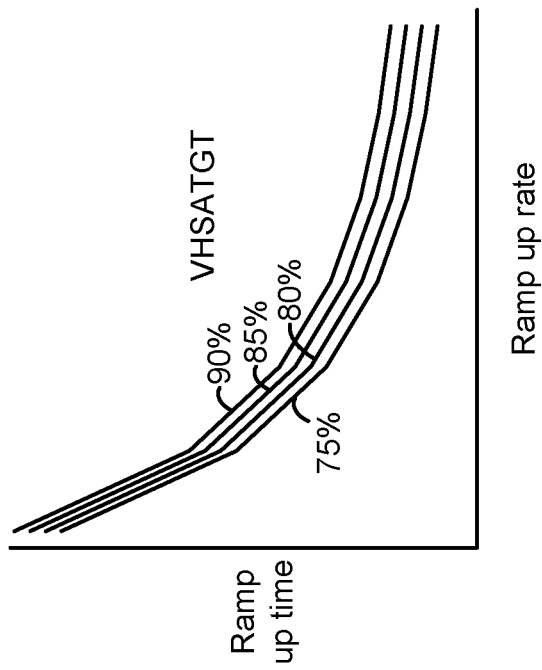
FIG. 17A depicts a plot of a ramp up time as a function of a ramp up rate and a target voltage, consistent with FIG. 16A-16C.

FIG. 17A depicts a plot of a ramp up time as a function of a ramp up rate and a target voltage, consistent with FIG. 16A-16C. The ramp up time, in which the ramp up rate is regulated, is lower when the ramp up rate is higher. Additionally, for a given ramp up rate, the ramp up time is lower when the target voltage VHSATGT is lower. The plots depict target voltages of 75, 80, 85 and 90%.

FIG. 17B depicts a plot of peak current consumption as a function of a ramp up rate and a target voltage, consistent with FIG. 16A-16C. The peak current consumption (peak Icc) is higher when the ramp up rate is higher. Additionally, for a given ramp up rate, the peak Icc is higher when the target voltage is lower. The plots depict target voltages of 75, 80, 85 and 90%. The plots for target voltages of 85 and 90% overlap at lower ramp up rates and merge with the plot for an 80% target voltage at higher ramp up rates, indicating the peak current is dominated by the ramp up rate instead of the target voltage in this example. When the ramp up rate is high, the reduction in current from using a higher target voltage is relatively small. There is a tradeoff between reducing peak current and reducing program time.

Figure 18A:
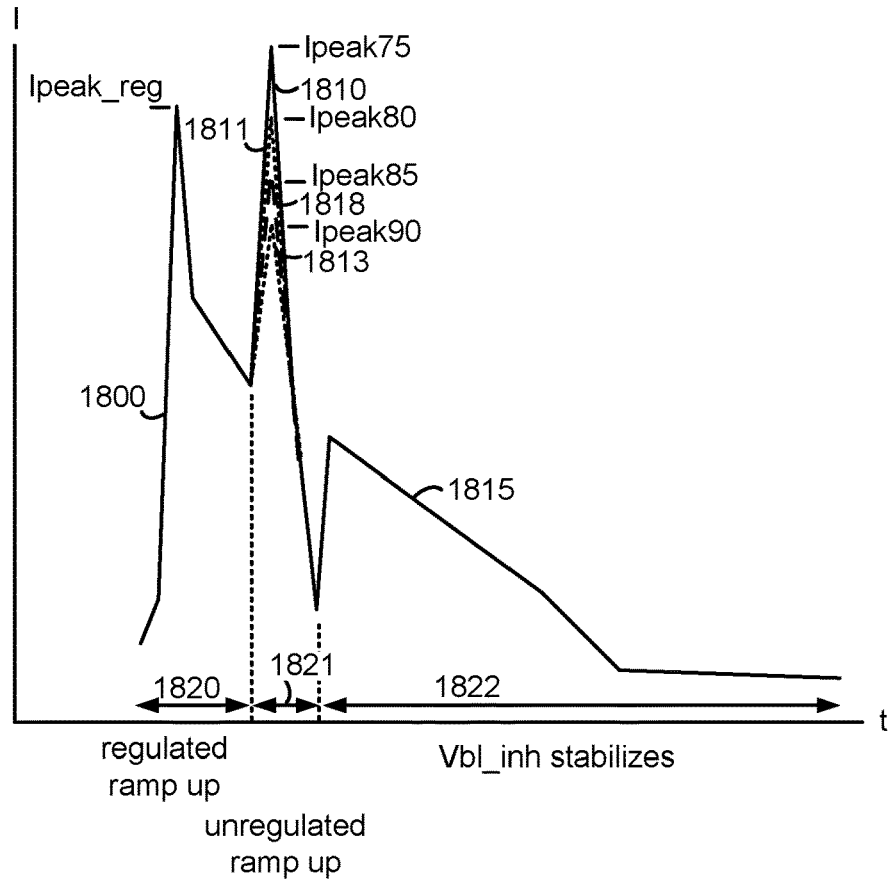
FIG. 18A depicts a plot of current consumption versus time in SLC programming, showing how a peak current during a transition of a bit line voltage from a target voltage to a final voltage varies as a function of the target voltage.

FIG. 18A depicts a plot of current consumption versus time for SLC programming, showing how a peak current during a transition of a bit line voltage from a target voltage to a final voltage varies as a function of the target voltage. When the target voltage VHSATGT is relatively low, the peak current is relatively high due to the relatively large unregulated increase in the bit line voltage from VHSATGT to VHSA. There is also a current peak during the regulated ramp up.

Time periods 1820 and 1821 involve regulated and unregulated ramp ups, respectively, of the bit line voltage. A time period 1822 involves a stabilization of the bit line voltage at VHSA. During the regulated ramp up, Ipeak, as depicted by a plot 1800 increases to a peak level of I_peak_reg. Subsequently, at the start of the unregulated ramp up, Ipeak increases a peak level of Ipeak75, Ipeak80, Ipeak85 or Ipeak90, as depicted by plots 1810-1813, respectively. As noted, the peak current is higher when the target voltage is lower. Further, the peak current can be greater during the unregulated ramp up than during the regulated ramp up, when VHSATGT is relatively low. The plot 1815 depicts a reduction in the peak current as the bit line voltage stabilizes at VHSA.

In one approach, VHSATGT is set at a level which causes Ipeak during the unregulated ramp up to not exceed Ipeak during the regulated ramp up during SLC programming and/or MLC programming.

Figure 18B:
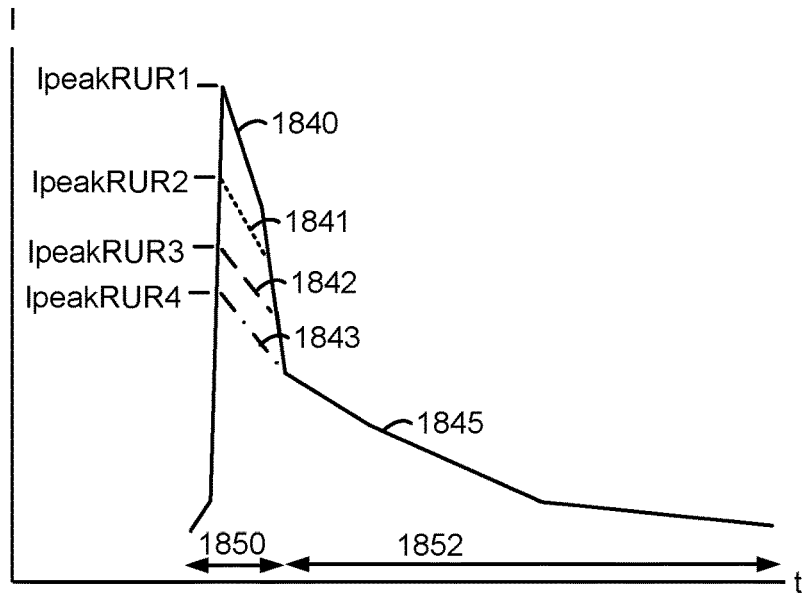
FIG. 18B depicts a plot of current consumption versus time in SLC programming, showing how a peak current during a regulated ramp up of a bit line voltage varies as a function of the ramp up rate.

FIG. 18B depicts a plot of current consumption versus time in SLC programming, showing how a peak current during a regulated ramp up of a bit line voltage varies as a function of the ramp up rate. A time period 1850 represents a regulated ramp up and a time period 1852 involves a stabilization of the bit line voltage at VHSA. The peak current is higher when the regulated ramp up rate is higher. RUR1-RUR4 denotes different regulated ramp up rates, where RUR1>RUR2>RUR3>RUR4. During the regulated ramp up, Ipeak=IpeakRUR1, IpeakRUR2, IpeakRUR3 or IpeakRUR1, as depicted by plots 1840-1843, respectively. The plot 1845 depicts a reduction in the peak current as the bit line voltage stabilizes at VHSA. The unregulated ramp up is not used in this example.

Figures 19, 20A, 20B:
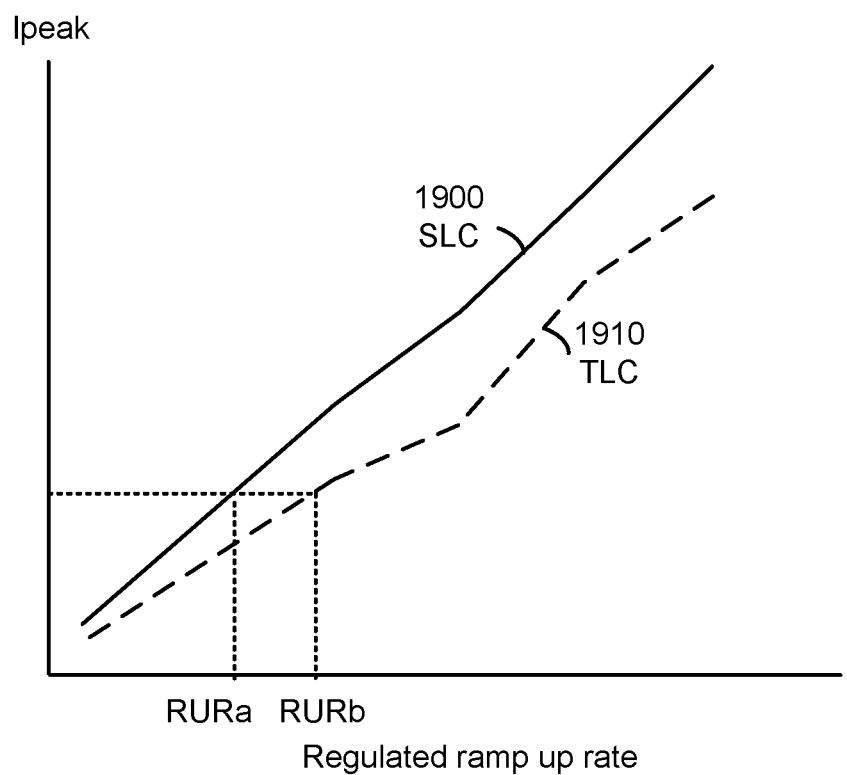
FIG. 19 depicts a plot of peak current versus a regulated ramp up rate for SLC and TLC programming.
FIG. 20A depicts a table of different values of a target voltage VHSATGT for a regulated ramp up of a bit line voltage.
FIG. 20B depicts a table of different values of a regulated ramp up rate VHSASLOW for a bit line voltage.

FIG. 19 depicts a plot of peak current versus a regulated ramp up rate for SLC and TLC programming. For a specified level of Ipeak, a higher ramp up rate can be used for TLC programming than for SLC programming. TLC (three-level cell) is a type of MLC programming with three bits per cell. The Ipeak values are representative of the different program loops of the program operations. This allows the program time to be shorted by using a higher regulated ramp up rate (RURb) for TLC programming while staying within the specified level of Ipeak. For SLC programming, a lower regulated ramp up rate (RURa) can be used. This minimizes the SLC program time within the constraint of the specified level of Ipeak.

As mentioned, this approach is optimal as SLC programming inhibits a relatively large portion of the bit lines in a program loop so that inter-bit line capacitance is relatively high. Peak current is also therefore relatively high, for a given ramp up time period. Generally, VHSASLOW should be lower for SLC programming than for MLC programming.

In view of the above, it can be concluded that the optimal setting of VHSASLOW and VHSATGT are different for SLC and MLC programming. For VHSATGT, SLC programming can use smaller setting without having an issue with peak current. Generally, the target voltage can be an increasing function of the number of bits per cell to program into the selected memory cells. Optimizing the parameters in this way reduces SLC program time. For VHSASLOW, SLC programming can have a more relaxed, lower setting comparing to MLC. Optimizing the parameters in this way reduces MLC program time. Generally, the regulated ramp up rate can be an increasing function of the number of bits per cell to program into the selected memory cells.

Moreover, the optimization of these parameters has no impact on cell reliability but represents a tradeoff purely between performance and power consumption.

FIG. 20A depicts a table of different values of a target voltage VHSATGT for a regulated ramp up of a bit line voltage. The tables of FIGS. 20A and 20B can be maintained by the state machine or other control circuit to set the value of VHSATGT and VHSASLOW. In these examples, two bits are allocated for four values. Generally, one or more bits can be allocated in each table to define two or more values of VHSATGT and VHSASLOW. A data structure other than a table could also be used.

With Bit0=0 and Bit1=0, VHSATGT=75% of VHSA. With Bit0=0 and Bit1=1, VHSATGT=80% of VHSA. With Bit0=1 and Bit1=0, VHSATGT=85% of VHSA. With Bit0=1 and Bit1=0, VHSATGT=90% of VHSA. Note that 75, 80, 85 and 90% are examples only as other values may be used.

FIG. 20B depicts a table of different values of a regulated ramp up rate VHSASLOW for a bit line voltage. With Bit0=0 and Bit1=0, VHSASLOW=RUR1. With Bit0=0 and Bit1=1, VHSASLOW=RUR2. With Bit0=1 and Bit1=0, VHSASLOW=RUR3. With Bit0=1 and Bit1=1, VHSASLOW=RUR4. RUR1>RUR2>RUR3>RUR4.

Accordingly, it can be seen that in one implementation, an apparatus comprises: a first voltage source configured to output a program-inhibit voltage signal to unselected bit lines among a plurality of bit lines in a program operation, the plurality of bit lines are connected to respective NAND strings in a set of NAND strings, and the respective NAND strings comprises memory cells; and a control circuit configured to connect to the first voltage source. The control circuit is configured to: control a ramp up of the program-inhibit voltage signal based on a number of bits per cell to program into selected memory cells of the respective NAND strings.

In another implementation, a method comprises: increasing a voltage signal from an initial voltage to a program-inhibit voltage in a program operation for memory cells, the memory cells are connected to respective bit lines; and connecting the voltage signal to the respective bit lines, the increasing of the voltage signal is different according to whether the memory cells are programmed to a single bit per cell or to multiple bits per cell.

In another implementation, an apparatus comprises: a set of memory cells connected to a selected word line, each memory cell is arranged in a respective NAND string of a set of NAND strings; a set of bit lines, each bit line is connected to a respective NAND string in the set of NAND strings; and a first voltage source configured to apply a program-inhibit voltage signal to selected bit lines in the set of bit lines, the first voltage source is configured to increase the program-inhibit voltage signal from an initial voltage to a program-inhibit voltage and, when a program pulse is applied to the selected word line in a program operation, to maintain the program-inhibit voltage signal at the program-inhibit voltage, the increasing of the program-inhibit voltage signal is a function of a number of bits per cell to be stored in the set of memory cells in the program operation.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a first voltage source configured to output a program-inhibit voltage signal to unselected bit lines among a plurality of bit lines during a program operation, the plurality of bit lines are connected to respective NAND strings in a set of NAND strings, and the NAND strings comprise memory cells; and
a control circuit configured to connect to the first voltage source, the control circuit is configured to:
control a ramp up of the program-inhibit voltage signal based on a number of bits per memory cell to program into selected memory cells of the respective NAND strings including ramping up at a first rate when programming a first number of bits per memory cell and ramping up at a second rate when programming a second number of bits per memory cell, the first number is less than the second number and the first rate is less than the second rate.

2. The apparatus of claim 1, wherein:
to control the ramp up of the program-inhibit voltage signal, the control circuit is configured to instruct the first voltage source to output the program-inhibit voltage signal with a regulated ramp up rate until the program-inhibit voltage signal reaches a target voltage, after which the program-inhibit voltage signal increases at an unregulated ramp up rate from the target voltage to a final program-inhibit voltage.

3. The apparatus of claim 2, wherein:
the regulated ramp up rate is an increasing function of the number of bits per memory cell to program into the selected memory cells.

4. The apparatus of claim 2, wherein:
the target voltage is an increasing function of the number of bits per memory cell to program into the selected memory cells.

5. The apparatus of claim 2, wherein:
the regulated ramp up rate is a function of the number of bits per memory cell to program into the selected memory cells; and
the target voltage is a function of the number of bits per memory cell to program into the selected memory cells.

6. The apparatus of claim 2, wherein:
the control circuit is configured to ramp up the program-inhibit voltage signal differently according to whether a single bit is programmed into the selected memory cells or whether multiple bits are programmed into the selected memory cells.

7. The apparatus of claim 2, wherein:
the ramp up of the program-inhibit voltage signal occurs prior to application of a program pulse to the selected memory cells.

8. The apparatus of claim 2, wherein:
the final program-inhibit voltage is independent of the number of bits per memory cell to program into the selected memory cells.

9. The apparatus of claim 1, further comprising:
a second voltage source configured to output a program-enable voltage signal to selected bit lines among the plurality of bit lines in the program operation, wherein the control circuit is configured to connect to the second voltage source, and to control the program-enable voltage signal to have a fixed voltage.

10. A method, comprising:
increasing a voltage signal from an initial voltage to a program-inhibit voltage in a program operation for memory cells, the memory cells are connected to respective bit lines; and
connecting the voltage signal to the respective bit lines, the increasing of the voltage signal is slower when the memory cells are programmed to a single bit per memory cell than when the memory cells are programmed to multiple bits per memory cell.

11. The method of claim 10, wherein:
the program-inhibit voltage is the same when the memory cells are programmed to the single bit per memory cell and when the memory cells are programmed to the multiple bits per memory cell.

12. The method of claim 10, wherein:
the voltage signal is increased from the initial voltage to a target voltage at a regulated rate and from the target voltage to the program-inhibit voltage at an unregulated rate; and
the regulated rate is less when the memory cells are programmed to the single bit per memory cell than when the memory cells are programmed to the multiple bits per memory cell.

13. The method of claim 12, wherein:
the target voltage is greater when the memory cells are programmed to the multiple bit per memory cell than when the memory cells are programmed to the single bits per memory cell.

14. The method of claim 10, wherein:
the voltage signal is increased from the initial voltage to a target voltage at a regulated rate and from the target voltage to the program-inhibit voltage at an unregulated rate.

15. The method of claim 10, wherein:
the voltage signal remains at the program-inhibit voltage during application of a program voltage to the memory cells.

16. An apparatus, comprising:
a set of memory cells connected to a selected word line, each memory cell is arranged in a respective NAND string of a set of NAND strings;
a set of bit lines, each bit line is connected to a respective NAND string in the set of NAND strings; and
a first voltage source configured to apply a program-inhibit voltage signal to selected bit lines in the set of bit lines, the first voltage source is configured to increase the program-inhibit voltage signal from an initial voltage to a program-inhibit voltage and, when a program pulse is applied to the selected word line in a program operation, to maintain the program-inhibit voltage signal at the program-inhibit voltage, the increasing of the program-inhibit voltage signal is a function of a number of bits per memory cell to be stored in the set of memory cells in the program operation such that the program-inhibit voltage signal is increased at a first rate when programming a single bit per memory cell and increased at a second rate when programming multiple bits per memory cell, the first rate is less than the second rate.

17. The apparatus of claim 16, wherein:
to increase the program-inhibit voltage signal from the initial voltage to the program-inhibit voltage, the first voltage source is configured to increase the program-inhibit voltage signal from the initial voltage to a target voltage at a rate which is a function of the number of bits per memory cell to be stored in the set of memory cells in the program operation, and to then increase the program-inhibit voltage signal from the target voltage to the program-inhibit voltage.

18. The apparatus of claim 17, wherein:
the rate at which the program-inhibit voltage signal is increased from the initial voltage to the target voltage is a regulated rate; and
the increase of the program-inhibit voltage signal from the target voltage to the program-inhibit voltage is at an unregulated rate.

19. The apparatus of claim 16, wherein:
to increase the program-inhibit voltage signal from the initial voltage to the program-inhibit voltage, the first voltage source is configured to increase the program-inhibit voltage signal from the initial voltage to a target voltage which is a function of the number of bits per memory cell to be stored in the set of memory cells in the program operation, and to then increase the program-inhibit voltage signal from the target voltage to the program-inhibit voltage.

20. The apparatus of claim 19, wherein:
the first voltage source is configured to increase the program-inhibit voltage signal from the initial voltage to the target voltage at a rate which is a function of the number of bits per memory cell to be stored in the set of memory cells in the program operation.

* * * * *